United States Patent [19]
Oae et al.

[11] Patent Number: 5,401,974
[45] Date of Patent: Mar. 28, 1995

[54] CHARGED PARTICLE BEAM EXPOSURE APPARATUS AND METHOD OF CLEANING THE SAME

[75] Inventors: Yoshihisa Oae; Takamasa Satoh; Yasushi Takahashi; Kiichi Sakamoto; Hiroshi Yasuda; Soichiro Arai; Moritaka Nakamura, all of Kawasaki, Japan

[73] Assignee: Fujitsu Limited, Kawasaki, Japan

[21] Appl. No.: 191,458

[22] Filed: Feb. 3, 1994

[30] Foreign Application Priority Data

Mar. 18, 1993 [JP] Japan .................. 5-059133

[51] Int. Cl.⁶ .............................. H05H 1/00
[52] U.S. Cl. .................. 250/492.2; 250/492.1; 250/424
[58] Field of Search ............ 250/492.1, 492.2, 306, 250/307, 310, 311, 492.21, 396 R, 431, 423 R, 424; 315/111.21; 15/1.51

[56] References Cited

U.S. PATENT DOCUMENTS 4,665,315  5/1987  Bucchetti et al. ......... 250/492.21
5,312,519  5/1994  Sakai et al. ................. 134/1

FOREIGN PATENT DOCUMENTS 61-20321   1/1986  Japan .
61-59826   3/1986  Japan .
3-19314    1/1991  Japan .

Primary Examiner—Jack I. Berman
Assistant Examiner—James Beyer
Attorney, Agent, or Firm—Staas & Halsey

[57] ABSTRACT

In a charged particle beam exposure apparatus in which a charged particle beam is projected onto a member to be exposed to thereby form a pattern thereon, there are provided a plurality of electrodes disposed around an optical axis of the charged particle beam, a first unit for introducing a gas containing oxygen as a main component into an inside of the charged particle beam exposure apparatus including the plurality of electrodes and for holding the inside of the apparatus at a degree of vacuum between 0.1 Torr and 4 Torr, and a second unit for selectively applying either a high-frequency signal having a frequency between 100 kHz and 800 kHz or a reference signal to each of the plurality of electrodes. A plasma radical state of the gas is generated in the inside of the apparatus so that a deposition present in the apparatus can be eliminated.

25 Claims, 19 Drawing Sheets

FIG. 11A
FIG. 11B
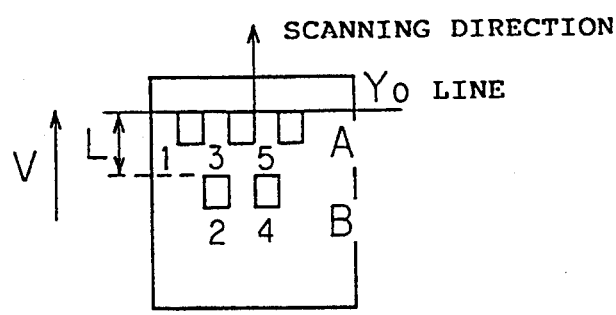
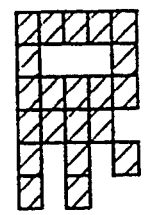
FIG. 11C(1)  FIG. 11C(2)  FIG. 11C(3)  FIG. 11C(4)
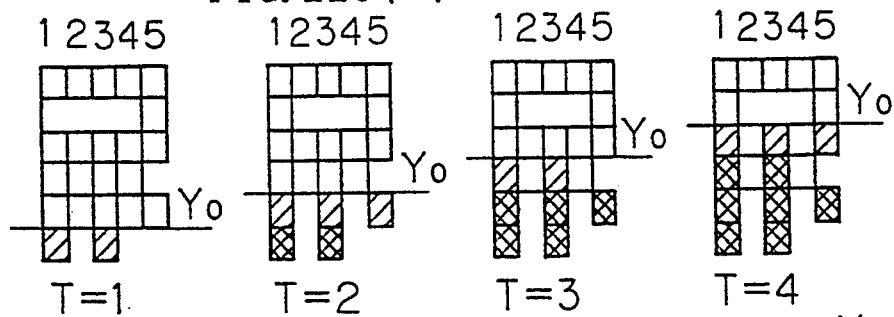
T=1  T=2  T=3  T=4
FIG. 11C(5)  FIG. 11C(6)  FIG. 11C(7)  FIG. 11C(8)
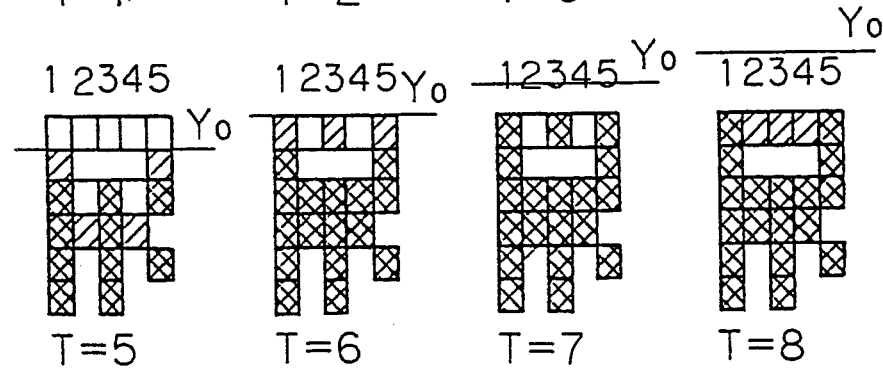
T=5  T=6  T=7  T=8

CHARGED PARTICLE BEAM EXPOSURE APPARATUS AND METHOD OF CLEANING THE SAME

BACKGROUND OF THE INVENTION

1. Field of the Invention

The present invention relates to a charged particle beam exposure apparatus using a variable rectangularly-shaped beam or a blanking aperture array and a method of cleaning such a charged particle beam exposure apparatus.

2. Background of the Invention

Recently, integrated circuit devices have widely been applied to various fields, such as computers, communications and mechanical controls with improvements in the integration density and functions. For example, DRAM devices have been improved to have increasing integration densities, such as 1 Mbits, 4 Mbits, 16 Mbits, 64 Mbits, 256 Mbits and 1 Gbits. Such an improvement in the integration density much depends on an advance of fine production techniques.

With such an improvement in the integration density, an exposure apparatus using a charged particle beam such as an electron beam have been developed in order to form fine patterns. Such a charged particle beam exposure apparatus enables a fine production equal to or less than 0.05 $\mu$m with a positional precision of 0.02 $\mu$m or less.

In the charged particle beam exposure apparatus, the electron beam is stabilized in order to expose a target member such as a wafer to precisely draw a pattern thereon in a predetermined position. Particularly, it is important for the electron beam not to be degraded due to a time deterioration.

In the conventional charged particle beam exposure apparatus, a deterioration in the exposure precision is caused by beam drifts. There are the following four different types of beam drifts:

(1) A charge-up drift due to a contamination on electrostatic deflection electrodes in a projection lens or a lower portion of a column tube in which the electron beam runs;

(2) A charge-up drift occurring on the upstream side of a reduction lens;

(3) A thermal drift due to heat generated in a coil of an electromagnetic deflector; and (4) A positional drift resulting from contraction of an exposed member or a stage caused by heat generated in a focusing lens (a relative beam position drift).

Recently, it has become possible to much suppress the beam drifts (3) and (4) so that a time deterioration caused by these beam drifts is negligible by employing a thermal compensation, a thermal decomposition and/or cooling of the lens coil. However, in the present situation the charge-up drifts (1) and (2) are suppressed by disassembling the exposure apparatus, cleaning the parts thereof and replacing old parts by new ones (an overhaul).

For example, a contamination on the lower portion of the column tube causes the above charge-up drift (1). Such a contamination is caused so that a gas generated from an organic material by projecting high-energy particles onto a resist formed on the target member for exposure is deposited on the lower portion, or a carbon component contained in a gas generated by reflected electrons is evaporated on the lower portion. Hence, the contamination on the lower portion of the column tube includes insulating members. When charges such as reflected beams and secondary electrons are stored in the contamination, an electric field with respect to the potentials of peripheral portions is generated, so that the position of electron beam is varied (beam drift). Further, the charges are stored in the contamination in different ways when different patterns are exposed. Hence, it is substantially impossible to systematically evaluate the charge-up drifts and systematically perform a compensation process for compensating the charge-up drifts. In practice, it is very difficult to ensure surface cleanness of parts formed by plating or metallizing the surfaces of alumina parts. For example, a liquid for plating remains in the plated surface or a pin hole occurs therein during the cleaning process.

With the above in mind, in practice, the field correction coefficients (gain, rotation, trapezoid and offset) of the deflectors indicating the characteristics of the column tube are periodically measured. Then, the drift is separated into components, which are compensated for during the exposure process. When the quantity of drift per unit time exceeds a threshold level, the column tube is disassembled and cleaned and old parts are replaced by new ones.

The aforementioned charge-up drift (2) is caused by a contaminates deposited on slits. In order to cope with the charge-up drift (2), the field correction coefficients are periodically calculated, and the column tube is disassembled and cleaned and old parts are replaced by new ones as necessary.

Particularly, there is a problem in a charged particle beam exposure apparatus using a blanking aperture array (BAA: hereinafter such an apparatus is referred to as a BAA electron beam exposure apparatus). The final beam shape is defined by controlling the electron beams which have passed through a large number of apertures. Hence, the electron beams are directly projected onto the BAA without any break during the exposure process. As a result, organic members contained in the resist and/or the vacuum are deposited on the BAA, and the contamination is charged up and electrified very early. The charged-up BAA bends the orbits of the electron beams passing through the BAA. Hence, the electron beams may be cut by an aperture member located on the downstream side of the BAA. Further, the electron beams which should be cut by the BAA may pass through the BAA. These phenomena prevent desired patterns from being drawn on the target member. In addition, the above phenomena change with time.

In order to cope with the charge-up drift (2), overhaul of the column tube is carried out as in the case of the charge-up drift (1). For example, the BAA which has expired is replaced by a new one.

As described above, the overhaul process is needed to cope with the charge-up drifts (1) and (2), and much time and labor are needed. Further, it is necessary to adjust the apparatus after assembling the parts into the apparatus.

A method has been designed to eliminate the above-mentioned disadvantages of the electron beam exposure apparatus (see Japanese Laid-Open Patent Application No. 61-20321). The proposed method cleans the inside of the exposure apparatus in the following manner. A rod-shaped electrode is inserted into the column tube along the axis thereof. A high-frequency voltage is applied across the inner wall of the column tube and the inserted electrode, and thereby plasma is generated inside the column tube. The plasma thus generated functions to eliminate depositions on the inside of the column tube (ashing).

Japanese Laid-Open Patent Application No. 61-59826 discloses another cleaning method. Parts and electrodes located in the vacuum area in the column tube of the exposure apparatus are isolated from the ground and a high-frequency voltage is applied to the parts and electrodes. An oxygen gas has been introduced into the column tube. Oxygen gas plasma is generated by the application of the high-frequency voltage, and eliminates a contamination containing carbon compounds deposited on the parts and electrodes (ashing).

Japanese Laid-Open Patent Application No. 3-19314 discloses the following cleaning method, which will be described with reference to FIG. 1. The proposed method uses a column tube 1, which is located above a target member to be exposed. A main body 2 of the column tube 1 is made of an insulating ceramic member. T-shaped recesses 3 are formed on the inner surface of the column tube 1. This inner surface of the column tube 1 having the T-shaped recesses 3 is plated with an electrically conductive member such as gold. Thereafter, gold plated portions of parts 3a of the recesses 3 are removed by an electrical discharge machining. Electrically conductive portions 4a through 4h, formed by gold plating, are electrically isolated from each other along the optical axis of the column tube 1, so that electrodes are formed. A high-frequency signal generated by an oscillator 5 is applied across each of pairs of opposite electrodes. For the sake of simplicity, FIG. 1 shows that the high-frequency signal is applied across only a single pair of opposite electrodes.

A cleaning gas such as an oxygen gas, which is introduced into the column tube 1, becomes radical due to the application of the high-frequency signal, and cleans the inner surface of the main body 2 of the column tube 1.

However, the cleaning methods described above have the following respective disadvantages.

The cleaning method disclosed in Japanese Laid-Open Patent Application No. 61-203121 needs a complex structure which inserts the rod-shaped electrode into the column tube. An experiment conducted by the inventors shows that plasma containing a gas in the radical state cannot be widely generated stably for a long time and can be generated within a very narrow range around the rod-shaped electrode for only a very short time.

Japanese Laid-Open Patent Application N. 61-59826 discloses only the principle of the cleaning method. The inventors have also confirmed through their experiment that plasma containing a gas in the radical state cannot be widely generated stably for a long time.

Further, the inventors have confirmed through their experiment that plasma containing a gas in the radical state cannot be widely generated stably for a long time. For example, the inventors have confirmed that plasma cannot be generated under a slightly different condition and plasma is generated or not generated under the same condition.

From the above considerations, it is concluded that the above-mentioned proposed cleaning methods cannot be applied to practical use, and some improvements therein will be needed. Further, the proposed cleaning methods are not capable of efficiently cleaning, without overhaul, parts other than the electrodes, such as the BAA.

SUMMARY OF THE PRESENT INVENTION

It is a general object of the present invention to provide a charged particle beam exposure method and a cleaning method for the same in which the above disadvantages are eliminated.

A more specific object of the present invention is to provide a charged particle beam exposure method having a cleaning mechanism, and a cleaning method for the same, capable of continuously stably generating plasma widely for a long time and of efficiently and effectively eliminating depositions on not only the inside of a column tube but also its peripheral portions and depositions on a blanking aperture array and other portions likely to receive contamination.

The above objects of the present invention are achieved by a charged particle beam exposure apparatus in which a charged particle beam is projected onto a member to be exposed to thereby form a pattern thereon, the charged particle beam exposure apparatus comprising: a plurality of electrodes disposed around an optical axis of the charged particle beam; first means for introducing a gas containing oxygen as a main component into an inside of the charged particle beam exposure apparatus including the plurality of electrodes and for holding the inside of the apparatus at a degree of vacuum between 0.1 Torr and 4 Torr; and second means for selectively applying either a high-frequency signal having a frequency between 100 kHz and 800 kHz or a reference signal to each of the plurality of electrodes, a plasma radical state of the gas being generated in the inside of the apparatus so that a deposition present in the apparatus can be eliminated.

The above objects of the present invention are also achieved by a charged particle beam exposure method in which a charged particle beam is projected onto a member to be exposed to thereby form a pattern thereon, the charged particle beam exposure method comprising: (a) introducing a gas containing oxygen as a main component into an inside of a charged particle beam exposure apparatus including the plurality of electrodes; (b) holding the inside of the apparatus at a degree of vacuum between 0.1 Torr and 4 Torr; and (c) selectively applying either a high-frequency signal having a frequency between 100 kHz and 800 kHz or a reference signal to each of the plurality of electrodes, a plasma radical state of the gas being generated in the inside of the apparatus so that a deposition present in the apparatus can be eliminated.

BRIEF DESCRIPTION OF THE DRAWINGS

Other objects, features and advantages of the present invention will become more apparent from the following detailed description when read in conjunction with the accompanying drawings, in which:

FIGS. 11A, 11B and 11C are diagrams showing how a pattern is drawn by using the blanking aperture array;

DESCRIPTION OF THE PREFERRED EMBODIMENTS

Figure 2:
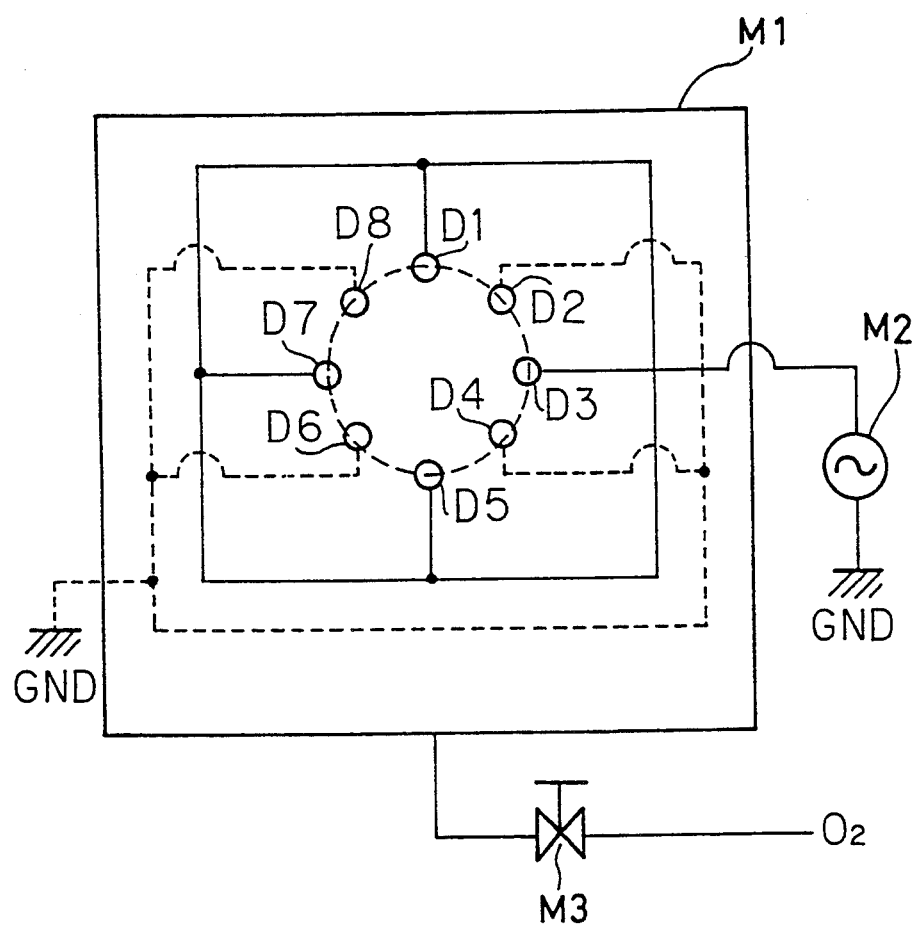
FIG. 2 is a diagram of the principle of the present invention.

FIG. 2 is a diagram of the principle of the present invention. A plurality of electrodes (for example, sub-deflector electrodes) D1 through D8 are arranged about the optical axis of a charged particle beam at approximately equal intervals within a main chamber M1 of a charged particle beam exposure apparatus. A gas containing oxygen as a major component is introduced into the main chamber M1 via a valve M3, and the main chamber M1 is kept at a degree of vacuum equal to 0.1 Torr to 4 Torr.

Each of the electrodes D1 through D8 is connected to either a high-frequency signal source M2 or ground GND. At the time of cleaning, it is preferable to alternately apply a high-frequency signal and the ground potential to neighboring electrodes. In the structure shown in FIG. 2, the high-frequency signal is applied to the electrode D1, and the two neighboring electrodes D2 and D8 are set to the ground potential. Further, the same signal (voltage) is applied to pairs of selected opposite electrodes. For example, the high-frequency signal is applied to the pair of opposite electrodes D1 and D5, and the pair of opposite electrodes D3 and D7 and the pairs of opposite, neighboring electrodes D2 and D6, and D4 and D8, are set to the ground potential.

The frequency of the high-frequency signal is, for example, between 100 kHz and 800 kHz.

Figure 1:
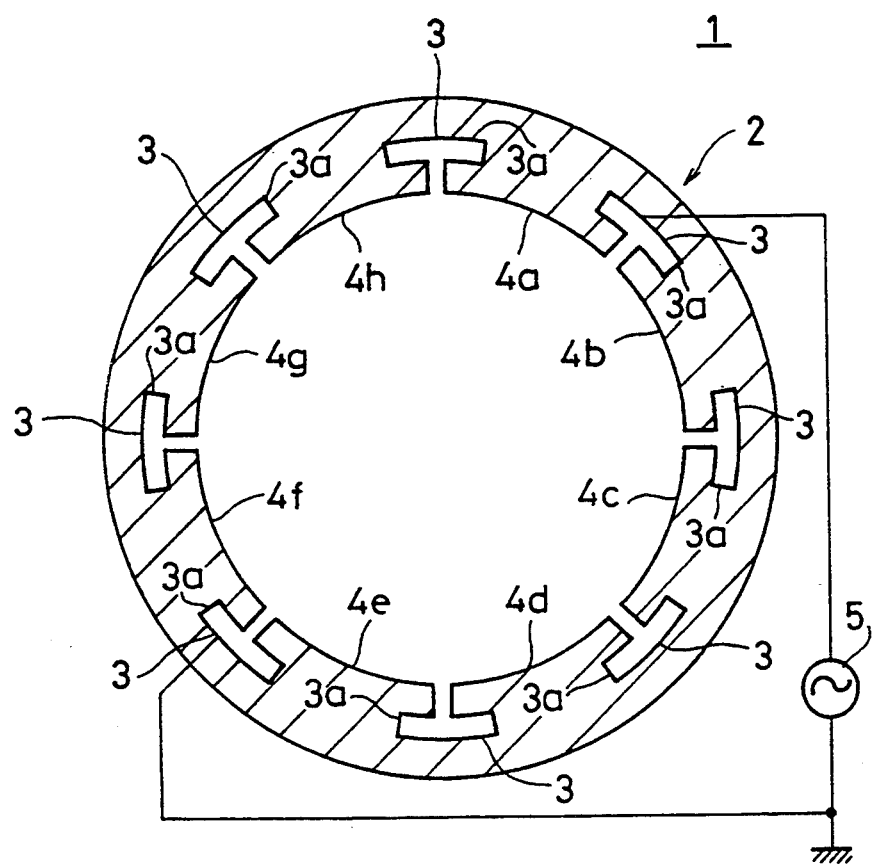
FIG. 1 is a plan view of an electrode used in a conventional cleaning method.

When the ground-potential signal and the high-frequency signal are applied, variously, to the electrodes D1 through D8, as shown in FIG. 2, it has been confirmed that plasma containing radicals of oxygen is stably generated widely, as compared with the structure shown in FIG. 1.

As will be described later, it becomes possible to more stably and widely generate plasma containing oxygen in a plasma radical state by setting a parameter (output and/or applied time) regarding the high frequency other than the frequency thereof to be within a predetermined range and by setting the shape of the electrodes D1–D8, the distance between the opposite electrodes, the distance between the lower ends of the electrodes and an exposed member, and/or the distance between a column tube and the exposed member.

When the electrodes D1 through D8 are those of the sub deflectors, the plasma radical state of oxygen is not only generated in the inside of the column tube but also applied to parts close to electrodes within a projection lens, whereby parts inside of the tube as well as the parts close to the electrodes within the projection lens can be cleaned. Further, in order to clean a blanking aperture array, the electrodes D1–D8 are provided in the vicinity thereof and are controlled in the same manner as described above.

A description will now be given, with reference to FIG. 3, of an electron beam exposure apparatus according to a first embodiment of the present invention.

Figure 3:
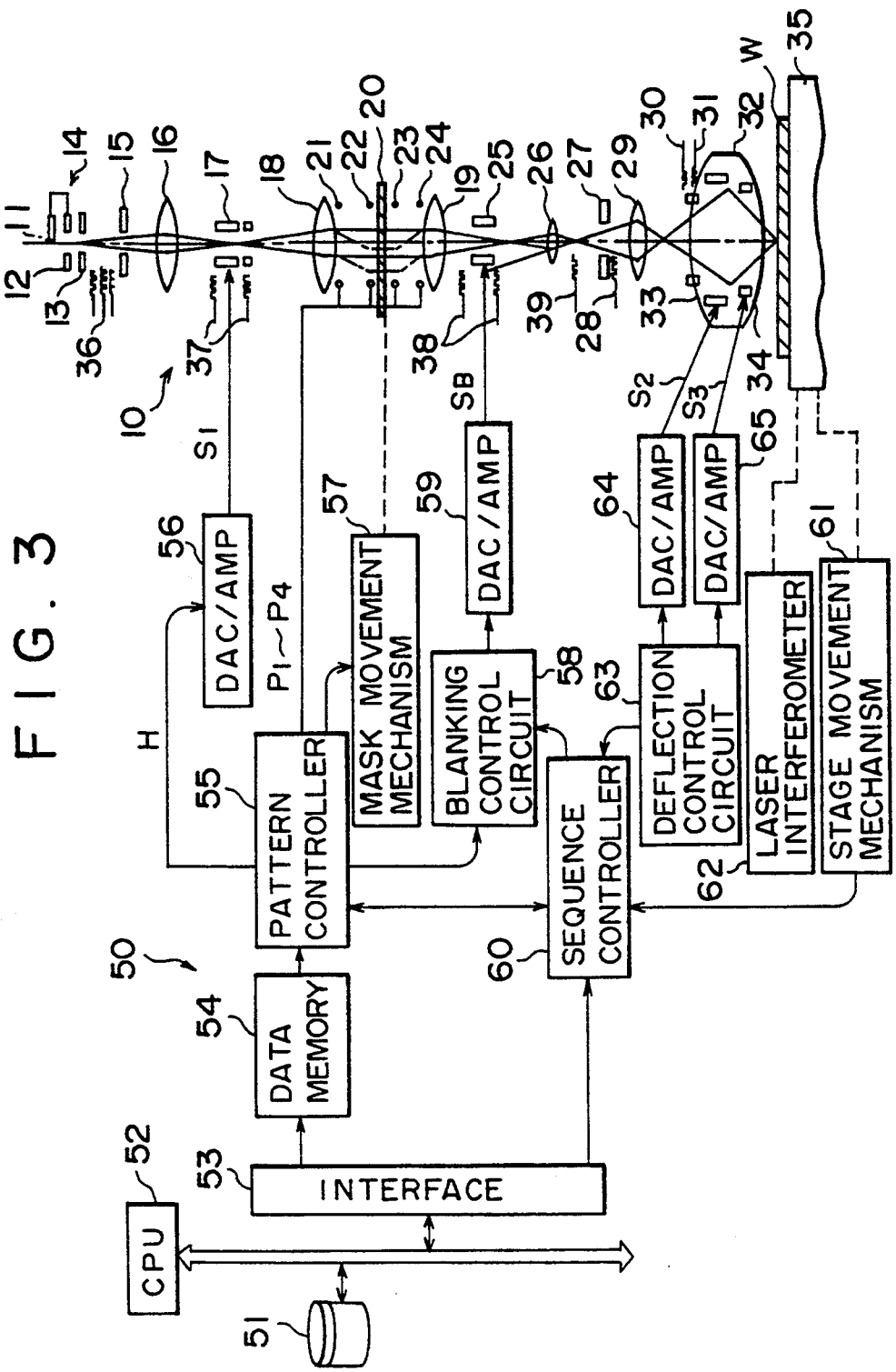
FIG. 3 is a diagram of the overall structure of a charged particle beam exposure apparatus according to a first embodiment of the present invention.

The exposure apparatus shown in FIG. 3 is mainly grouped into an exposure part 10 and a control part 50. The exposure part 10 functions to generate an electron beam, shape it into a spot or a pattern, and project the shaped beam onto a target position of an exposed member W. The control part 50 generates signals for controlling the exposure part 10. A stage 35 on which the exposed member W such as a wafer is placed is provided under the exposure part 10.

First, the exposure part 10 will be described. Electrons emitted from a cathode electrode 11 are drawn by grid electrodes 12 and anode electrodes 13. These electrodes 11, 12 and 13 form an electron beam generating source 14.

The cross section of the electron beam generated by the electron beam generating source 14 is shaped by means of a first slit 15 having a rectangular opening. Then, the electron beam passes through a first electronic lens 16 for focusing it, and enters a slit deflector 17 for deflecting the electron beam to correct the beam projecting position on a transparent mask 20. The slit deflector 17 is controlled by a correction deflection signal S1.

In order to shape the electron beam into a desired pattern, a transparent mask (stencil mask) 20 having a plurality of transparent holes such as block pattern openings or block pattern openings is used. The electron beam passing through the slit deflector 17 passes through an electron beam shaping part and is shaped into a desired pattern. The electron beam shaping part is made up of a second electronic lens 18, a third electronic lens 19, a transparent mask 20 and first through fourth deflectors 21 through 24. These parts are aligned along the optical axis. The transparent mask 20 is movable in the horizontal direction between the second electronic lens 18 and the third electronic lens 19. The first and second deflectors 21 and 22 are provided above the transparent mask 20, and the third and fourth deflectors 23 and 24 are provided below the transparent mask 20. The deflectors 21 through 24 deflect the electron beam in accordance with items P1–P4 of position information (data), and select one of plural transparent holes formed in the transparent mask 20.

The shaped electron beam is cut by a blanking electrode 25 or be allowed to pass through the blanking electrode 25 in response to a blanking signal $S_B$ applied thereto. The electron beam passing through the blanking electrode 25 is adjusted by means of a fourth electronic lens 26, an aperture 27, a refocusing coil 28 and a fifth electronic lens 29, and enters a focusing coil 30. The focusing coil 30 functions to focus the electron bean onto the surface of the wafer W. Further, a stig coil 31 is provided to correct astigmatism.

Furthermore, the position of the electron beam is controlled by a sixth electronic lens 32, a main deflector 33, and a sub deflector 34. The main deflector 33 is an electromagnetic deflector, which controls the position of the electron beam in response to an exposure position indicating signal S2. The sub deflector 34 is an electrostatic deflector, which controls the position of the electron beam in response to an exposure position indicating signal S3.

The wafer W is placed on the stage 35, which is movable in the X and Y directions, and is moved therein. Further, the exposure part 10 is equipped with first, second, third and fourth alignment coils 36, 37, 38 and 39.

The controller 50 includes a memory 51 and a CPU 52. Design data on an integrated circuit device is stored in the memory 51, and is read and processed by the CPU 52. Further, the CPU 52 controls the operation of the overall electron beam exposure apparatus.

An interface 53 transfers information to be drawn, as read by the CPU 52, to a data memory 54 and a sequence controller 60. Examples of the above information are information concerning the positions in which patterns should be formed and mask information concerning the transparent mask 20. The data memory 54 stores the drawn pattern information and the mask information transferred from the interface 53.

A pattern controller 55 receives the drawn pattern information and the mask information from the data memory 54, and specifies one of the transparent holes of the transparent mask 20. Then, the pattern controller 55 generates the pieces P1–P4 of the position information indicating the position of the specified transparent hole on the transparent mask 20. Furthermore, the pattern controller 55 has a specifying function, a holding function, a computing function and an outputting function in order to perform various processes. For example, the pattern controller 55 calculates a correction value H dependent on the difference between the pattern shape to be drawn and the shape of the specified transparent hole.

An amplifier 56 has a digital-to-analog conversion function and an amplifying function. The amplifier 56 receives the correction value H and generates the aforementioned correction deflection function S1. A mask moving mechanism 57 moves the transparent mask 20 in accordance with a related signal from the pattern controller 55, if necessary.

A blanking control circuit 58 generates the blanking control signal $S_B$ for controlling an amplifier 59 in accordance with a related signal from the pattern controller 55. The amplifier 59 has a digital-to-analog conversion function and an amplifying function.

The sequence controller 60 receives the drawn position information from the interface 53, and controls a drawing process sequence. A stage moving mechanism 61 moves the stage 35 in accordance with a related signal from the sequence controller 60. The movement of the stage 35 is detected by a laser interferometer 62, and is supplied to a deflection control circuit 63. The deflection control circuit 63 computes the exposure position on the wafer (wafer) W, and supplies related signals to amplifiers 64 and 65, which generate the exposure position indicating signals S2 and S3, respectively. Further, the deflection control circuit 63 supplies a related signal to the sequence controller 60. Each of the amplifiers 64 and 65 has a digital-to-analog conversion function and an amplifying function.

In the normal electron beam exposure, the main deflector 33, which is an electromagnetic deflector, deflects the electron beam within a deflection field having dimensions of 2–10 mm□. The sub deflector 34, which is an electrostatic deflector, deflects the electron beam within a deflection field having dimensions of 100 μm□.

Pattern data is read from the memory 51 by the CPU 52, and is transferred to and stored in the data memory 54. Based on the pattern data read from the data memory 54, the pattern controller 55 divides a pattern into parts, each of which can be exposed by one shot. The pieces of the pattern data divided in the shot unit are used to generate data for the main deflector 33, data for the sub deflector 34, data for the slit deflector 17 and the blanking signal $S_B$ in order to control the deflection of the electron beam.

A detector (not show for the sake of simplicity) is provided close to the wafer W to detect particles reflected by the stage 35 and the wafer W.

Figure 4:
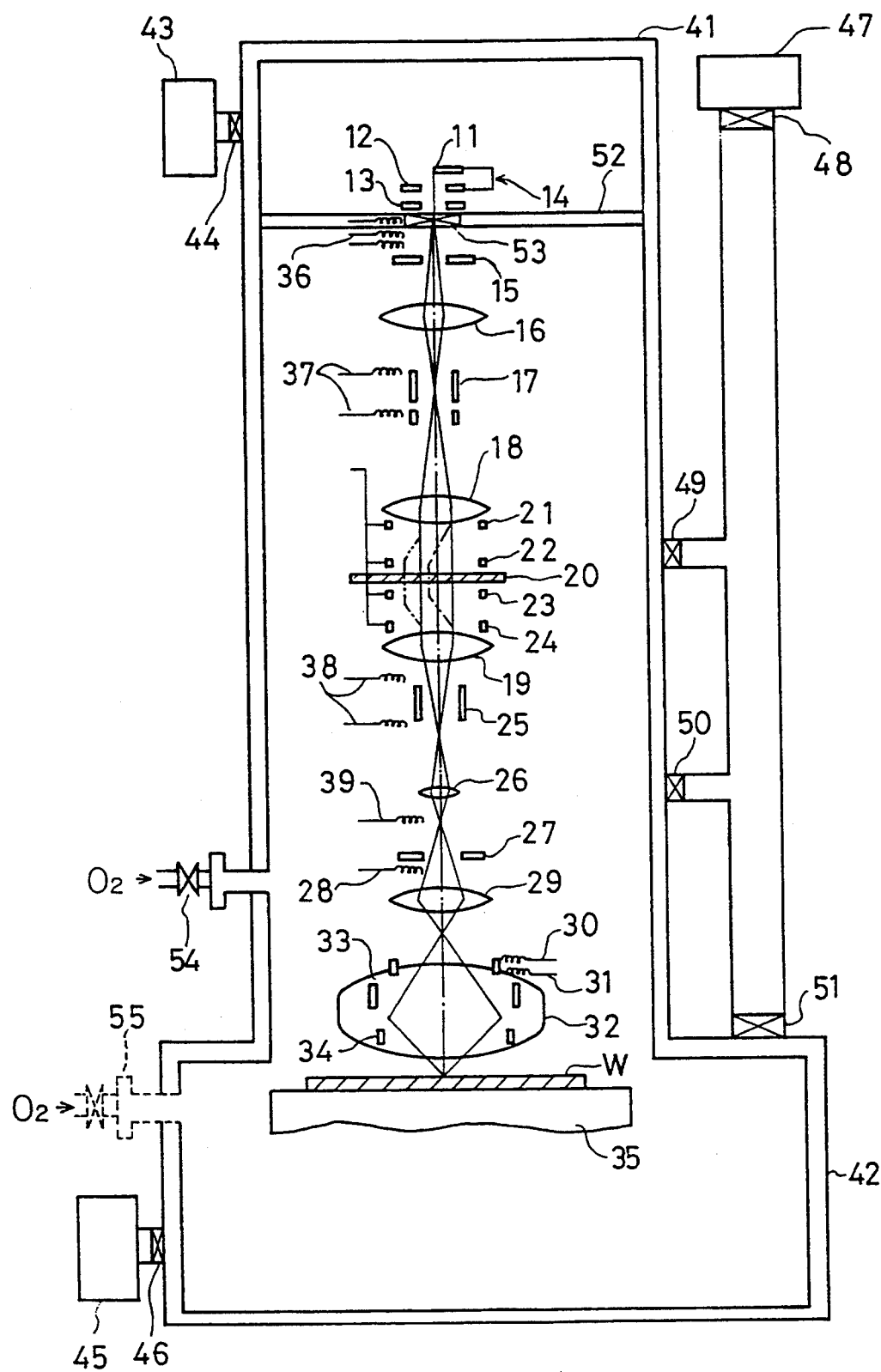
FIG. 4 is a diagram of a column tube and a main chamber of the apparatus shown in FIG. 3.

As shown in FIG. 4, a part between the 10 electron beam generating source 14 and the wafer W is covered by a column tube 41 and a main chamber 42. An exhaust pump 43 is connected to the upper portion of the column tube 41A via a valve 44. An exhaust pump 45 is connected to the main chamber 42 via a valve 46. Further, an exhaust pump 47 is connected to the column tube 41 and the main chamber 42 via valves 48 through 51. The inside of the column tube 41 can be segmented into a plurality of spaces by means of partitions having respective valves. For example, the electron beam generating source 14 is separated from the other space by a partition 52 having a valve 53. Further, a valve 54 for introducing the oxygen gas into the lower part of the column tube 41 is provided. It is possible to provide a valve 55 for introducing the oxygen gas into the main chamber 42 instead of or in addition to the valve 54.

Figure 5A:
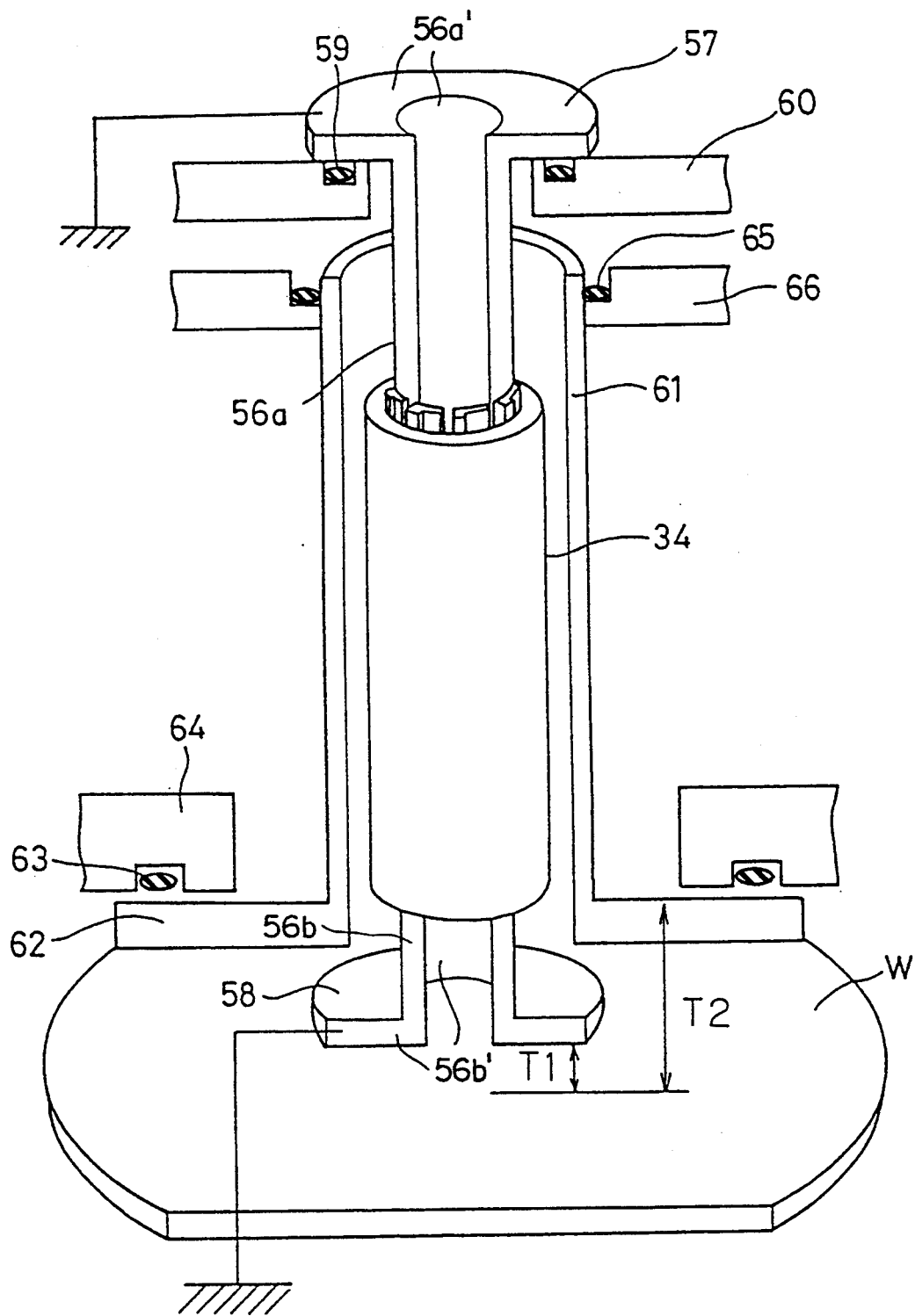
FIG. 5A is a partially cutaway perspective view of a sub deflector shown in FIGS. 3 and 4.
Figure 5B:
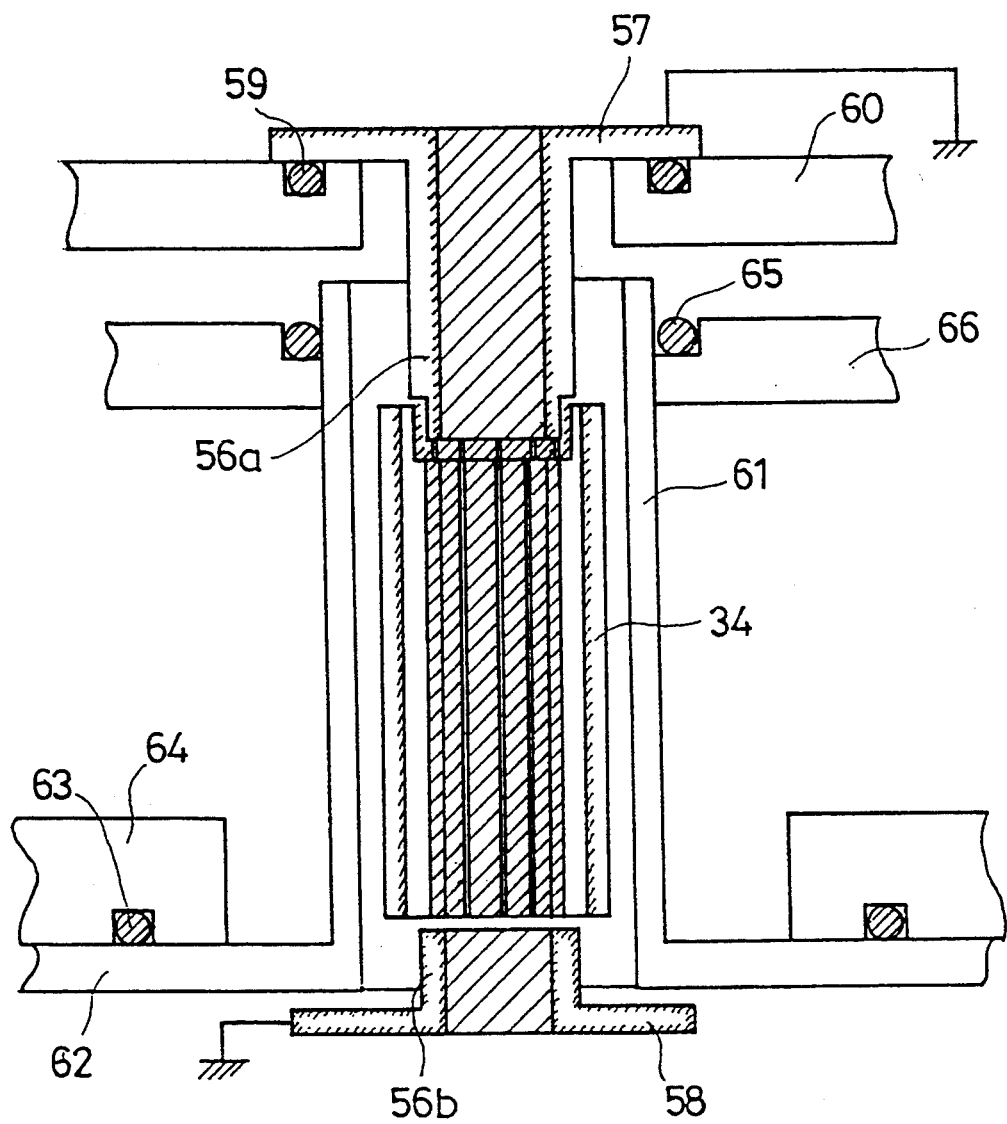
FIG. 5B is a cross-sectional view of the sub deflector shown in FIG. 5A.

FIG. 5A is a partially cutaway perspective view of the sub deflector 34, which is an electrostatic deflector, and its peripheral parts, and FIG. 5B is a cross-sectional view thereof. The sub deflector 34 is of a hollow cylindrical shape, and a plurality of electrodes are provided inside the sub deflector 34. The structure of the sub deflector 34 will be described in detail later.

A hollow cylindrical member 56a made of an insulating material is disposed above the sub deflector 34. The hollow cylindrical member 56a has a circular hollow cross-section, and has a ring-shaped flange 57 at the upper, free end thereof. An electrically conductive film is formed on the inner wall of the cylindrical member 56a and the upper surface of the flange 57 by, for example, plating. The flange 57 provided at the upper end of the cylindrical member 56a is fixed to a frame member 60 of the exposure apparatus via an O ring 59. A cylindrical member 56b made of an insulating material is disposed below the lower portion of the sub deflector 34. The cylindrical member 56b has a circular hollow cross-section, and has a ring-shaped flange 58 at the lower, free end thereof. The flange 58 faces the wafer W, and corresponds to the lower end of the column tube 41. An electrically conductive film 56b' is formed on the inner wall of the cylindrical member 56b and the entire surface of the flange by, for example, plating. As shown in FIGS. 5A and 5B, the cylindrical members 56a and 56b and the flanges 57 and 58 are set to the ground potential.

The sub deflector 34 is covered by a hollow cylindrical member 61 made of an insulating material, as shown on FIGS. 5A and 5B. A flange 62 is formed in the lower end of the cylindrical member 61, and is fixed to a frame member 64 of the exposure apparatus via an 0 ring 63. The upper portion of the cylindrical member 61 is fixed to a frame member 66 of the exposure apparatus via an 0 ring 66. The frame members 60 and 66 are made of an insulating material.

In order to stably generate the plasma radical state of a gas containing oxygen within a wide range, it is preferable to set the distance between the flange 58, that is, the lower end of the cylindrical member 56a and the surface of the wafer W to be equal to or less than 10 mm. Further, it is preferable to set the distance T2 between the lower ends of the electrodes of the sub deflector 34 and the surface of the wafer W to be equal to or less than 25 mm. It has been confirmed that the plasma radical state cannot be stably generated if the distances T1 and T2 are out of the respective ranges.

Figure 6A:
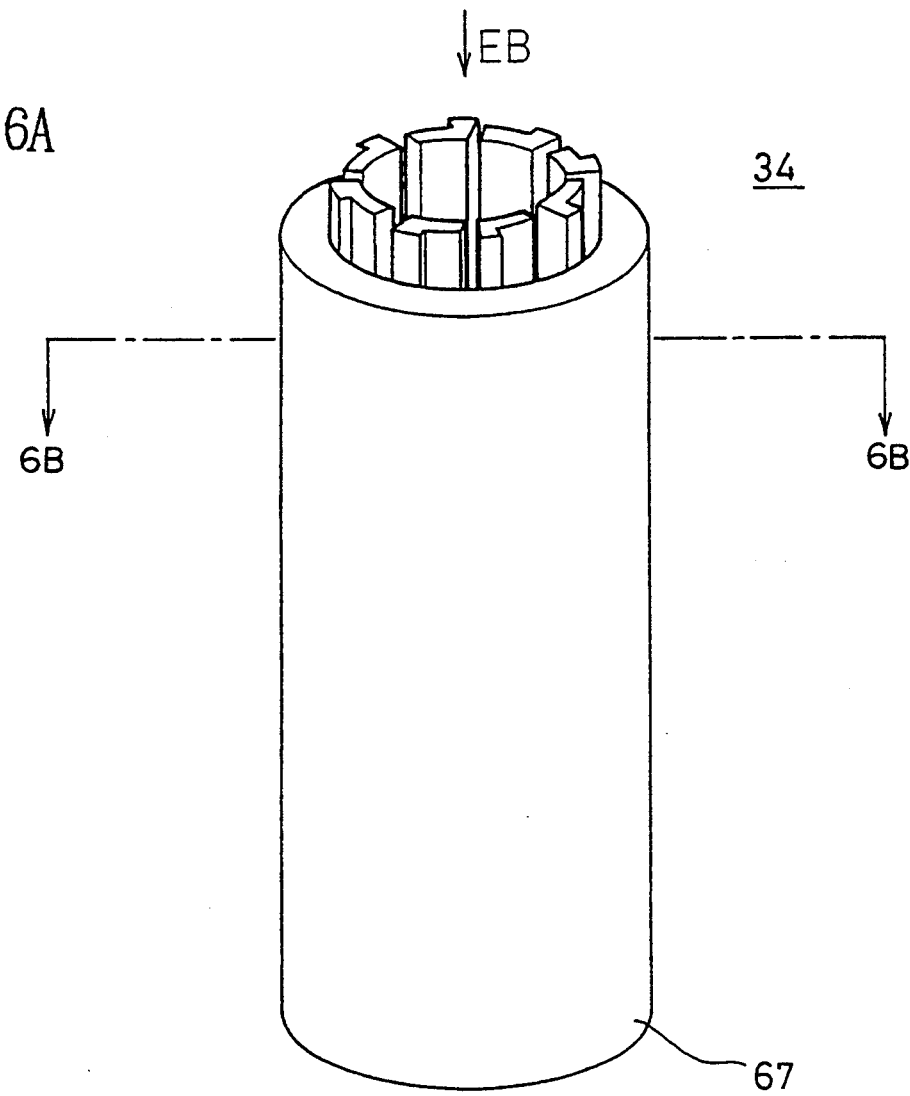
FIG. 6A is a perspective view of an electrode structure of the sub deflector.
Figure 6B:
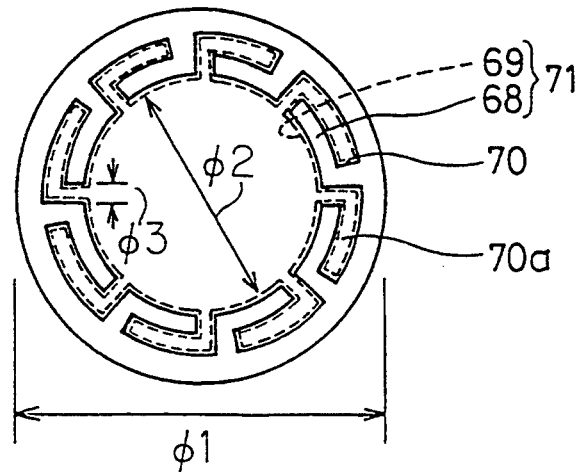
FIG. 6B is a cross-sectional view taken along line VI$_B$—VI$_B$ shown in FIG. 6A.

FIGS. 6A and 6B are diagrams of the structure of the sub deflector 34. More particularly, FIG. 6A is a perspective view of the sub deflector 34, and FIG. 6B is a cross-sectional view taken along line 6B—6B. The sub deflector 34 includes an electrode attachment cylinder 67 made of alumina ceramic. A plurality of electrode supporting parts 68, each having an approximately L-shaped cross section, is formed in the circular cross-section (i.e., cylindrical) inner wall of the electrode attachment cylinder 67. In the structure shown in FIGS. 6A and 6B, eight electrode supporting parts 68 are formed. Further, L-shaped grooves 70a are formed so as to face the electrode supporting parts 68. Electrically conductive films 69 are formed, by plating, on the inner wall of the electrode attachment cylinder 67 having the electrode supporting parts 68 except for electrode insulating portions 70. With the above structure, eight electrodes are formed. The electrode supporting parts 68 with the plated films 69 is continuously formed along the axis of the electrode attachment cylinder 67. As shown in FIG. 6A, the electrode supporting parts 68 with the plated films 69 project from the upper end of the electrode attachment cylinder 67. In the following description, the unified structure of the electrode supporting parts 68 and the plating films 69 is referred to as an electrode 71.

The diameter $\Phi 1$ of the outer circular surface of the electrode attachment cylinder 67 is, for example, 10 mm, and the distance $\Phi 2$ between the two opposite electrodes 71 is, for example, 6 mm. Further, the distance $\Phi 3$ between the neighboring electrodes 71 is, for example, 0.5 mm. It has been confirmed that the distance $\Phi 2$ is particularly related to stable generation of plasma, and is preferable to be within the range of 4–10 mm.

The sub deflector 34 can be produced as follows. An injection molding operation on clay alumina ceramic is carried out, and then a sintering process is carried out. Thereafter, the molded body is polished and plated. Then, the plated member is partially cut so that a plurality of electrodes 71, each having the plating member 69 and the electrode insulating portion 70, is formed.

Plural of interconnection patterns are formed on the outer circular surface of the cylindrical member 56 and the back surface of the flange 57, and are Connected to the plurality of electrodes 71 (eight electrodes in the structure shown in FIGS. 6A and 6B). The interconnection patterns isotropically formed in the radial directions on the back surface of the flange 57 are drawn to the outside of the apparatus (atmosphere) via the O ring 59. Portions of the O ring 59 facing the interconnection patterns are made of an insulating material. As shown in FIG. 2, either the high-frequency signal or the ground potential is applied to each of the eight electrodes of the sub deflector 34. In this case, the different signals are applied to the neighboring electrodes.

A description will now be given of the cleaning operation of the first embodiment of the present invention.

First, a gas containing oxygen as a major component is introduced into the column tube 41 via the valve 54 in the state in which the valves 49, 50 and 53 are closed. In this state, the main chamber 42 is exhausted by means of the exhaust pump 45 so that the inside of the main chamber 42 is kept at a predetermined degree of vacuum (between 0.1 Torr and 4 Torr, as has been described previously). At this time, a down-flow of the gas occurs in which the gas flows downwards in the exposure apparatus.

At the time of cleaning, the wafer W such as a silicon wafer is placed on the stage 35 as an exposed member. The silicon wafer W is positioned so that the center thereof substantially coincides with the center of the column tube 41.

The high-frequency signal and the groundlevel signal are applied to the electrodes 71 of the sub deflector 34, as shown in FIG. 2. In order to stably generate the plasma radical state of the oxygen containing gas, it is preferable that the frequency of the high-frequency signal is set to be between the 100 kHz and 800 kHz and the power thereof is set equal to or less than 100 W and that the total application time of the high frequency signal is equal to or less than 10 minutes. It is possible to apply the high-frequency signal and the ground-potential signal a plurality of times on the basis of the condition of contamination. It is preferable that one-minutes or less continuous application of the high-frequency signal is repeatedly performed within the above total application time at intervals of a few minutes. It has been confirmed thereby that the plasma radical state can be stably generated within a wide range. It will be noted that the frequency of the high-frequency signal used at the time of cleaning is lower than that thereof used during exposure.

The plasma radical is vertically generated along the down-flow of the gas. The gas flowing out of the flange 58 shown in FIGS. 5A and 5B is radially spread under the condition in which the aforementioned distance T1 is set equal to or less than 10 mm and the aforementioned distance T2 is set equal to or less than 25 mm. Hence, it becomes possible to clean not only the electrodes 71 but also parts located at the periphery of the electrodes 71 (up to the periphery of a not-shown reflected electron detector). At the time of cleaning, the electron beam generating source 14 is separated from the other parts and receives no influence.

Further, it becomes possible to reduce the time necessary to set the main chamber 42 to the vacuum state to approximately one hour without damaging parts because there is no need to set the main chamber 42 to the atmospheric pressure. That is, it is not necessary to disassemble the exposure apparatus and replace the old parts with new ones, and there is no possibility of mistakes resulting from the above disassembling and replacing operations. Further, it is not necessary to perform the adjustment operations for readjusting the optical axis, resetting the lens conditions, recalculating the correction coefficients of the deflectors and regenerating a deflection characteristic map (related to stig, focus and deformation) after the parts are assembled into the exposure apparatus, because there is no need to disassemble the exposure apparatus. Hence, it becomes possible to rapidly start the exposure apparatus after cleaning.

Alternatively, it is possible to employ an upward-flow of the gas containing oxygen gas instead of the down-flow. In this alternative, the gas is introduced via the valve 55 shown in FIG. 4, and is exhausted by the exhaust pump 47 via the valves 49 and 50. Thereby, the gas is made to flow upwards. In this case, the parts located in the vicinity of the upper portions of the electrodes 71 can be effectively cleaned. It is also possible to employ both the down-flow and the upward-flow.

The cleaning effects according to the present invention can be confirmed as follows. A film (resist) made of an organic material is coated on the wafer in advance. The organic material is evaporated because radicals come above the resist due to generation of plasma, or plasma is directly generated. By visually confirming the status of deposition of particles, the cleaning effects can be checked.

Figure 7:
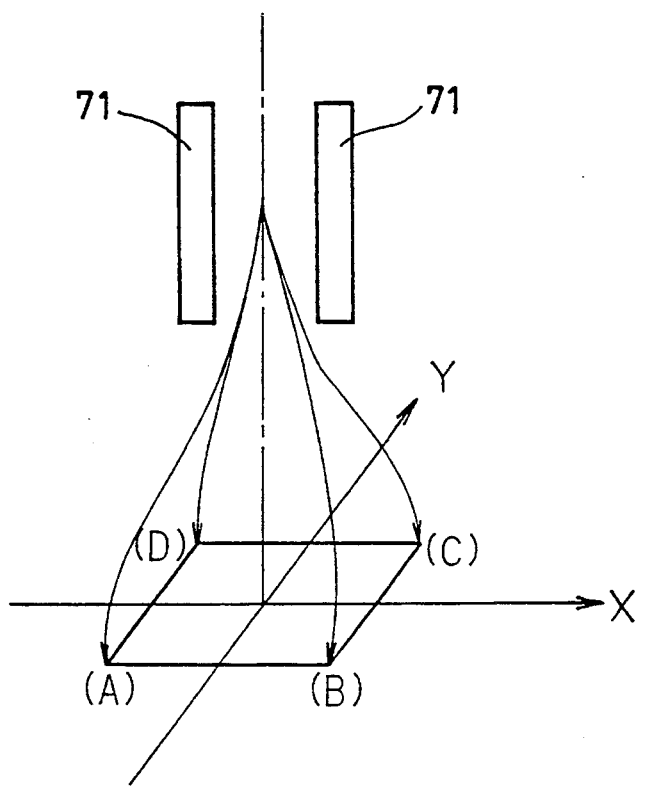
FIG. 7 is a diagram showing a test method of confirming the effects of the first embodiment of the present invention.

It is also possible to confirm the cleaning effects in an another manner. After cleaning, the introduced gas is exhausted and the electron beam is emitted. Next, as shown in FIG. 7, the electrodes 71 of the sub deflectors 34 are set to potentials causing the electron beam to be deflected to four corners (A), (B), (C) and (D) of an electrostatic deflection area. The electron beam is projected onto each of the corners for a few minutes to tens of minutes.

Figure 8:
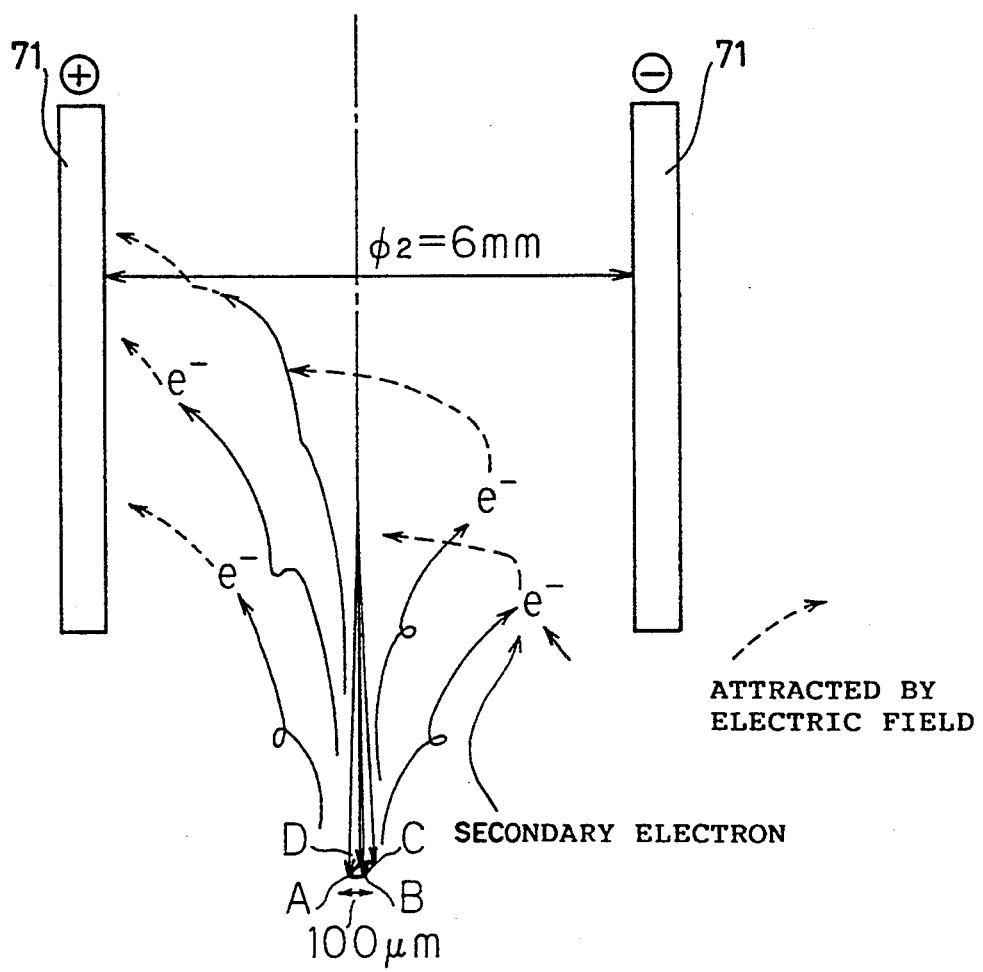
FIG. 8 is a diagram for explaining the principle of the method shown in FIG. 7.

As shown in FIG. 8, the electrodes 71 are much larger than the electrostatic deflection area (in the case shown in FIG. 8, the distance $\Phi 2$ between the opposite electrodes is 6 mm). Hence, it is considered that the numbers of electrons reflected by the corners (A), (B), (C) and (D) of the electrostatic deflection area and moving toward the electrodes 71 are almost the same as each other. However, the reflected electrons and the secondary electrons are attracted to the electrodes set at a positive potential due to the electric field caused by the electrodes 71. Hence, if the electrodes are contaminated, the electron beam has drifted by a charge (minus) stored in the contamination on the electrodes.

In the normal exposure operation, the beam is continuously projected onto the same position for a maximum time of a few microseconds. The entire field is scanned for a few seconds. Hence, the event than the same electric field is applied for a few seconds to tens of seconds increases approximately 1,000,000 times the time necessary to store a charge in the contamination on the electrodes. It may not be considered that the degree of acceleration test directly determines the degree of drift. However, the above procedure is the most sensitive measurement method for testing the degree of contamination on the electrodes.

FIG. 8 shows a beam drift (charge-up drift) caused at each corner of an electrostatic deflection area (100 $\mu m\square$) observed when the electron beam (3 $\mu m\square$) is projected on a wafer for 10 seconds. The heads of arrows shown in FIG. 8 indicate beam drift directions, and the lengths of the arrows indicate the degrees of beam drift.

Figure 9A:
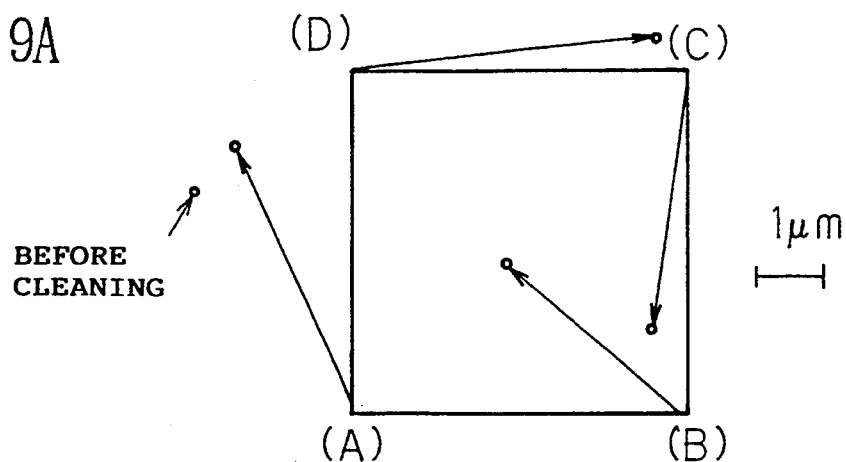
FIGS. 9A, 9B and 9C are diagrams showing the results of the test shown in FIG. 7.
Figure 9B:
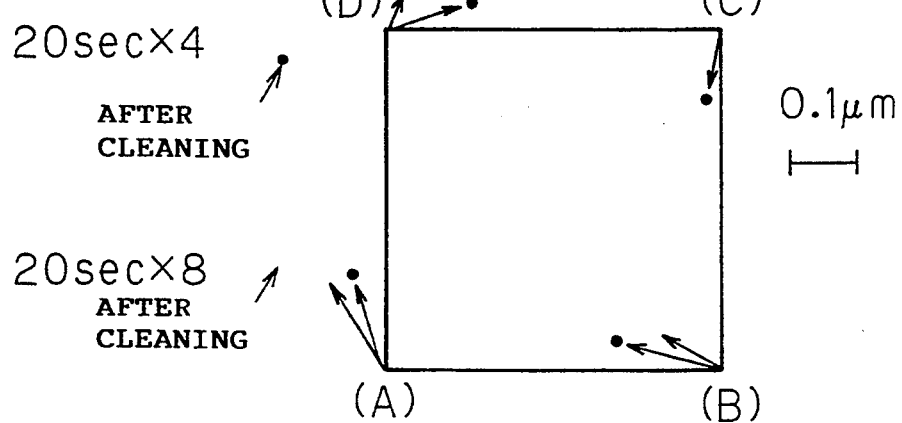
Figure 9C:
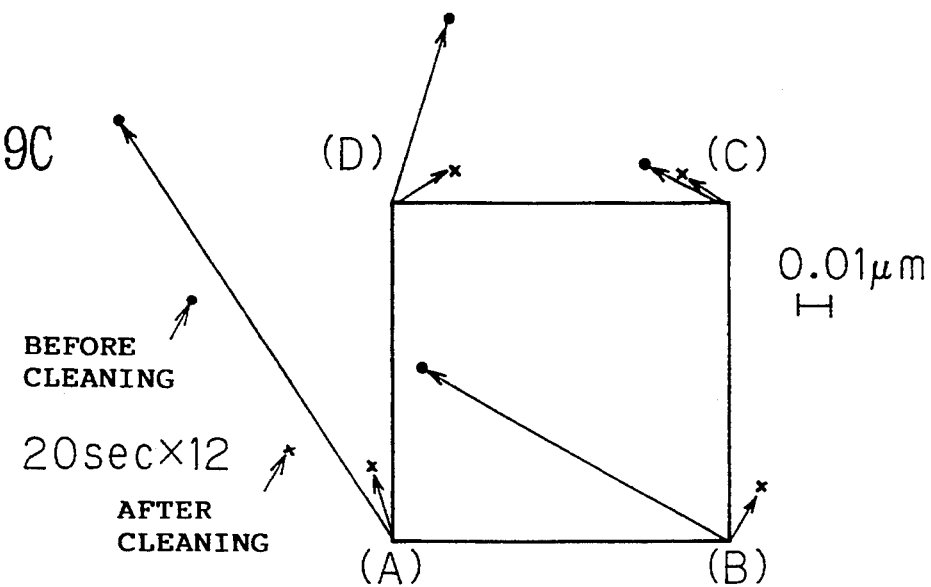

FIG. 9A shows a state before cleaning. FIG. 9B shows a state observed after a 20-second cleaning has been performed four times and eight times. FIG. 9C shows a state observed after the 20-second cleaning has been performed 12 times. It can be seen from FIGS. 9A, 9B and 9C that the degree of beam drift is decreased by the cleaning. That is, the contamination otherwise deposited on the electrodes has been eliminated (etched) by the cleaning.

A description will now be given of a second embodiment of the present invention, which is an electron beam exposure apparatus using a blanking aperture array (BAA). Hereinafter, such an apparatus is referred to as a BAA electron beam exposure apparatus. As has been described previously, in the BAA electron beam exposure apparatus controls the electron beams passing through a large number of apertures of the blanking aperture array whereby the final beam shape is formed. Hence, the electron beams are directly projected onto the blanking aperture array and is continuously applied during exposure. Hence, organic particles of a resist or in the vacuum are deposited on the blanking aperture array, and a charge-up phenomenon rapidly occurs in which a charge is stored in the deposition of organic particles. Due to the charge-up on the blanking aperture array, the orbits of the electron beams required to pass through the blanking aperture array are bent, and the electron beams may be cut by the aperture located on the downstream side of the blanking aperture array. Further, the electron beams required to be cut by the blanking aperture array may pass through the array. As a result, a desired pattern may not be drawn. Further, the above phenomenon will change with time.

The conventional technique copes with the above phenomenon by overhauling the exposure apparatus. That is, when the lifetime of the blanking aperture array expires, this array is replaced by a new one.

Figure 10:
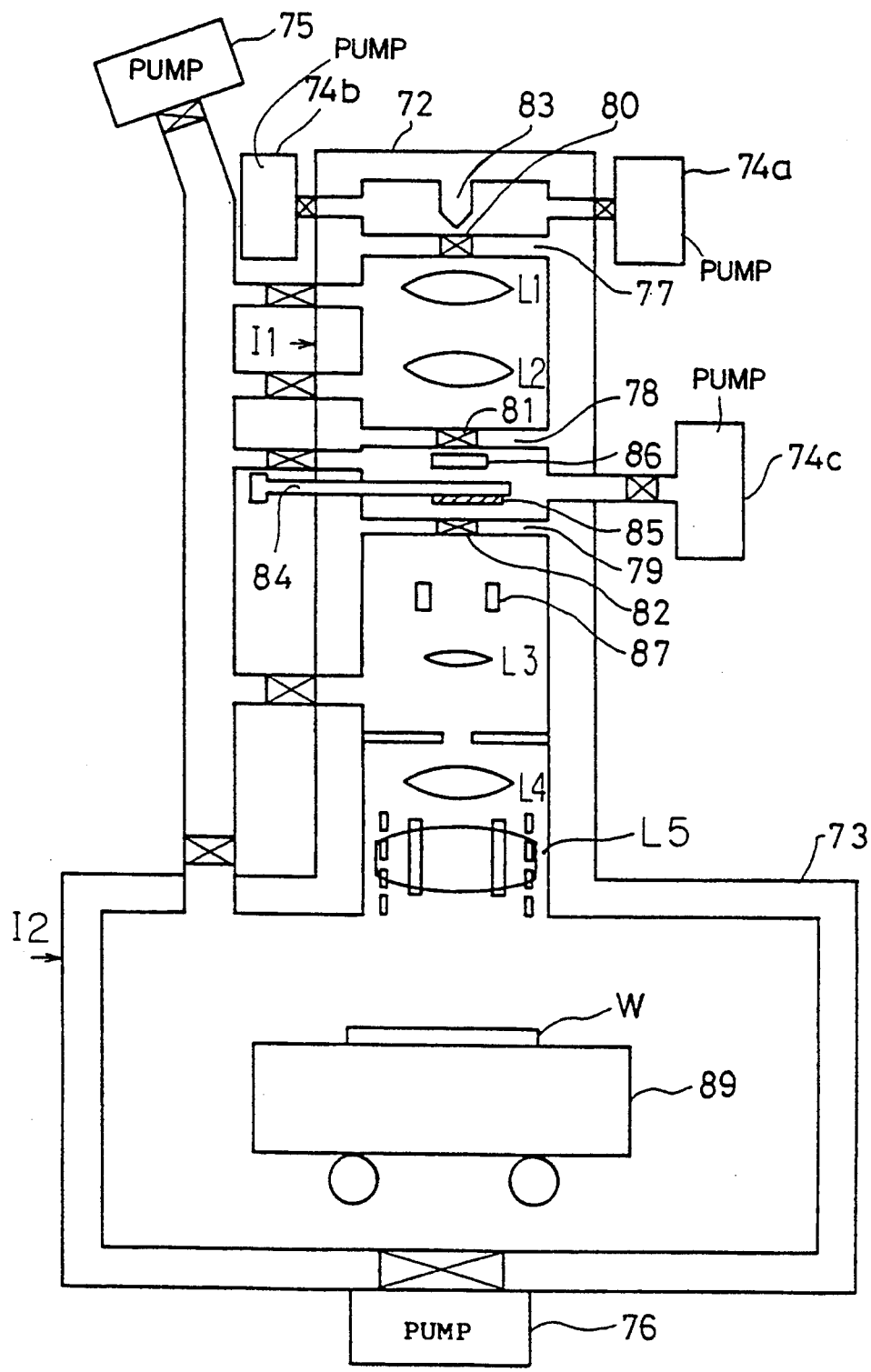
FIG. 10 is a diagram of a charged particle beam exposure apparatus utilizing a blanking aperture array according to a second embodiment of the present invention.

FIG. 10 is a diagram of the BAA electron beam exposure apparatus according to the second embodiment of the present invention. The BAA electron beam exposure apparatus includes a column tube 72 and a main chamber 73, and exhaust pumps 74a, 74b, 74c, 75 and 76 are attached thereto, as shown in FIG. 10. The inner area of the column tube 72 is divided into a plurality of spaces by partitions 77, 78 and 79. The partitions 77, 78 and 79 are respectively equipped with valves 80, 81 and 82. An electron beam generating source 83 is provided on the upper portion of the column tube 72. L1 and L2 respectively denote electronic lenses.

The space defined by the partitions 78 and 79 houses a blanking aperture array (BAA) 85 attached to a supporting member 84, and a cleaning electrode unit 86 located above the blanking aperture array 85. The cleaning electrode unit 86 functions to clean the blanking aperture array 85.

Blanking electrodes 87 and an electronic lens L3 are provided below the partition 82. Electronic lenses L4 and L5 are provided below the electronic lens L3. The electronic lens 5 includes a main deflector and a sub deflector. The main chamber 73 includes a stage 89 and a wafer W placed thereon.

The above-mentioned cleaning electrode unit 86 can be formed by, for example, the sub deflector 34 shown in FIGS. 6A and 6B. That is, the cleaning electrode unit 86 includes a plurality of electrodes 71 arranged along the inner surface of the electrode attachment cylinder 67. As shown in FIGS. 5A and 5B, the hollow cylindrical member 57 is inserted into the electrode attachment cylinder 56a, and the flange of the cylinder 56a is fixed to the frame 60 (which is provided in the vicinity of the partition 79 in the structure shown in FIG. 10) via the O ring 59. The leads extending from the electrodes 71 are provided as has been described previously. For the sake of simplicity, the cleaning electrode unit 86 is depicted as a block in FIG. 10.

A description will now be given, with reference to FIGS. 11A, 11B and 11C, of the principle of the operation of the BAA exposure apparatus. FIGS. 11A, 11B and 11C show how a pattern is drawn by the exposure process using the blanking aperture array 85. FIGS. 11A, 11B and 11C are simplified in order to facilitate easy understanding of the exposure process. More particulary, FIG. 11A shows a first row A and a second row B among a plurality of rows of the blanking aperture array 85. In FIG. 11A, the first row A includes three apertures 1, 3 and 5, and the second row B includes two apertures 2 and 4. A pattern shown in FIG. 11B is drawn by only the electrons passing through the first row A and the second row B, as shown in FIG. 11C. When the apertures 1, 3 and 5 of the first row A are spaced apart from each other with a pitch 2S in the direction orthogonal to the scanning direction of the electron beams, the apertures of the second row B are shifted by pitch S with respect to the apertures 1, 3 and 5 of the first row A.

In the example shown in FIGS. 11A through 11C, the scanning speed in the Y direction is 100 [μm]/5 [μsec], which is equal to 0.05 [μm]/2.5 [nsec]. Hence, ON/OFF signals applied to blanking electrodes (including ground electrodes and active electrodes) provided for the respective apertures 2 and 4 of the second row B are made to lag, by L/V (V denotes the speed of the raster scan), behind ON/OFF signals applied to blanking electrodes provided for the respective apertures 1, 3 and 5 of the first row A. In the example shown in FIGS. 11A through 11C, L=0.1 μm, and V=0.05 [μm]/2.5 [nsec], and L/V is equal to 5 nsec. In the above manner, when the electron beam moves to a predetermined position on the wafer, it is projected onto the wafer.

More particularly, as shown in FIG. 11C, at time T=1 (T has a unit equal to the time during which the raster scan moves 0.05 μm, and is equal to 2.5 nsec in the example shown in FIGS. 11A through 11C), two areas (emphasized by oblique lines in one direction) in the lowermost row in the pattern to be drawn are projected by the electron beams passing through the apertures 1 and 3 of the first row A. At time T=2, three areas (emphasized by oblique lines in one direction) in the second lowest row in the pattern to be drawn are projected by the electron beams passing through the apertures 1, 3 and 5 of the first row A. It will be noted that the areas emphasized by oblique lines in two directions in the lowermost row denote areas which have been projected at the previous time (that is, time T=1).

In the same manner as described above, two areas located in the next row are projected by the electron beams passing through the apertures 1 and 3 of the first row A at time T=3, and three areas located in the row next to the above row are projected by the electron beams passing through the apertures 1, 3 and 5 of the first row A at time T=4. At subsequent time T =5, two areas (emphasized by oblique lines in one direction) in the next row are projected by the electron beams passing through the apertures 1 and 5, and the remaining two areas located in the same row as those projected by the electron beams passing through the apertures 1 and 3 at time T=3 are projected by the electron beams passing through the apertures 2 and 4 of the second row B.

In the same manner as described above, all areas to be drawn have been projected (even in the direction orthogonal to the scanning direction) by the electron beams passing through the apertures of the blanking aperture array 85 at time T=8. It will be noted that the areas emphasized by the oblique lines in one direction are areas projected at the time of interest, and the areas emphasized by the oblique lines in two directions are areas which have been projected previously, i.e., prior to the above time of interest. Further, in FIG. 11C, the position of a reference line indicated as a Yo line shown in FIG. 11A is moved with the above raster scan.

The blanking aperture array 85 used in the second embodiment of the present invention has a plurality of rows disposed in the electron beam scanning direction. The same area is projected with different times within the same scan a plurality of times. In the example shown in FIGS. 11A through 11C, the exposure process for completing a pattern is divided into eight steps carried out with different timings. If it takes 20 nsec to completely expose an area (that is, the exposure time of the resist is 20 nsec), and the scanning speed per 0.05 μm is 2.5 nsec, an exposure time of 2.5 [nsec]×8=20 nsec can be ensured by the beam projection consisting of eight shots in which the apertures of the eight rows corresponding to the position of the area of concern are scanned.

Figure 12:
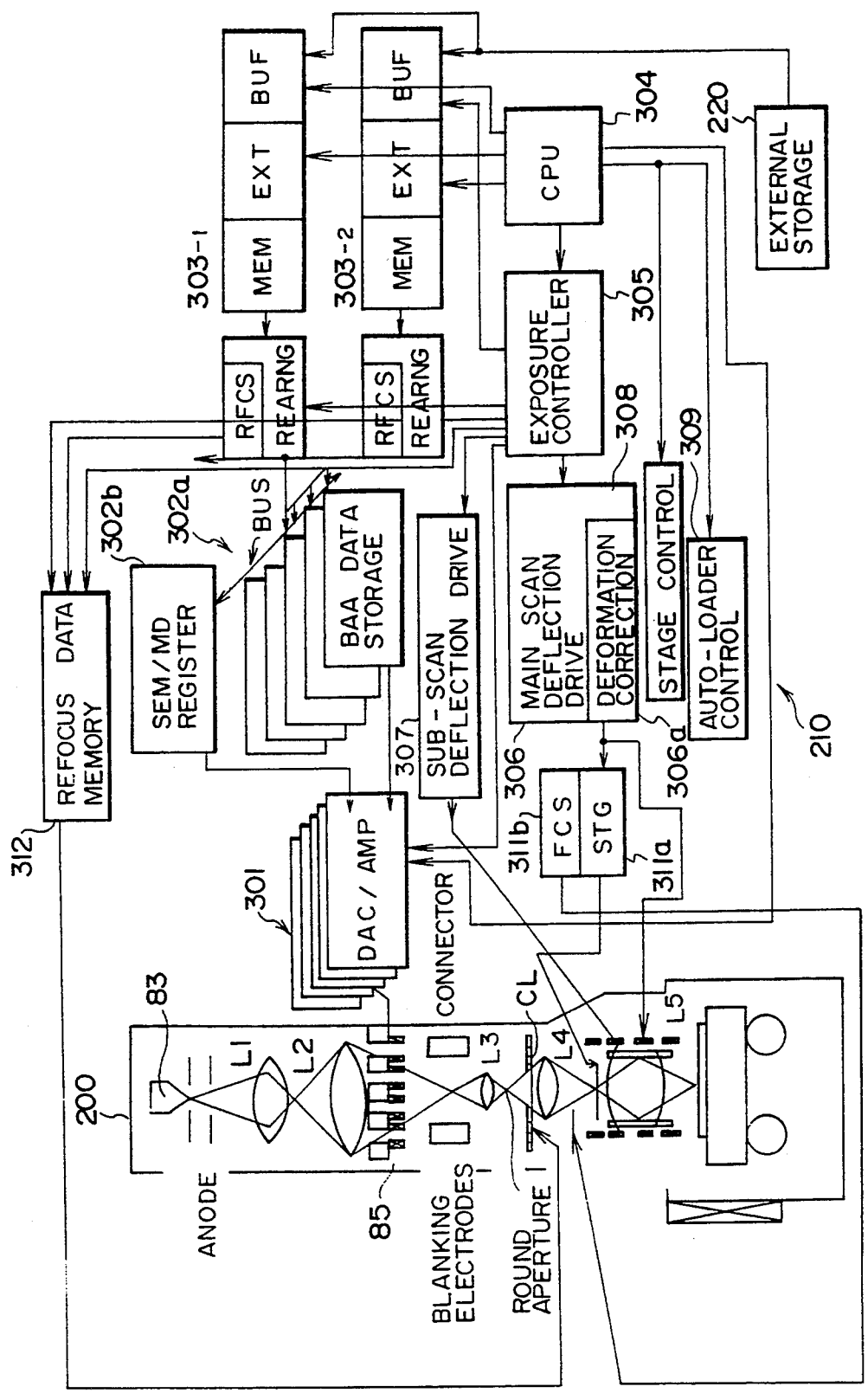
FIG. 12 is a diagram of the overall structure of the apparatus according to the second embodiment of the present invention.

FIG. 12 shows the overall structure of the BAA electron beam exposure apparatus including a control system for controlling the above-mentioned operation. An electron-optical system 200 shown in FIG. 12 is the same as that shown in FIG. 10. Some parts of the system 200 shown in FIG. 10 are omitted in FIG. 12.

A control system 210 of the BAA electron beam exposure apparatus is configured as follows. Exposure data is sent to two data extension circuits 303-1 and 303-2 from an external storage unit 220. Each of the data extension circuits 303-1 and 303-2 includes a buffer memory (BUF), a data extension circuit (EXT), a campus memory (MEM), and a refocus/data rearrangement circuit (RFCS/REARNG). The buffer memory stores the exposure data transferred from the external storage unit 220. The data extension circuit receives the exposure data from the buffer memory, and extends its an exposure pattern for each of the aperture rows. The campus memory stores the extended exposure pattern data. The refocus/data rearrangement circuit performs a process for correcting a deviation in the focal length due to Coulomb's repulsion generated when the electron beams are focused, and generates refocus data and the corrected exposure data. The refocus data is applied to a refocus coil C1 via a refocus data memory 312 in order to control the refocus coil C1. The corrected exposure data is output to a BAA data storage circuit 302a and an SEM/MD (Scanning Electron Microscopy/Mark Detection) register 302b. When either one of the data extension circuits 303-1 or 303-2 is outputting the exposure data to the BAA data storage circuit 302a and the SEM/MD register 302b, the other data extension circuit is extending the exposure data from the external storage unit 220.

The BAA data storage circuit 302a stores the exposure data, and sequentially outputs the exposure data as BAA data. The SEM/MD register 302b outputs pattern data for the SEM or MD when the SEM or MD is carried out. The BAA data is output to the blanking aperture array 85 via a digital-to-analog conversion/amplifier circuit (DAC/AMP) 301.

A CPU 304 controls the overall control system 210. An exposure controller 305 performs exposure control under the control of the CPU 304. More particularly, the exposure controller 305 controls a main scan deflection driving circuit 306 and a sub-scan deflection driving circuit 307 in order to deflect the electron beam on the wafer. The main scan deflection driving circuit 306 includes a deformation correcting circuit 306a, which performs a predetermined correction process, and controls the main scan deflector. A main deflection stig correction circuit (STG) 311a and a main deflection focus correction circuit (FCS) 311b perform respective corrections, and then control a stig coil C2 and a focus coil C3. The sub-scan deflection driving circuit 307 controls the sub-scan deflector. A stage controller 308 and an automatic loader controller 309 are controlled by the CPU 304.

Figure 13:
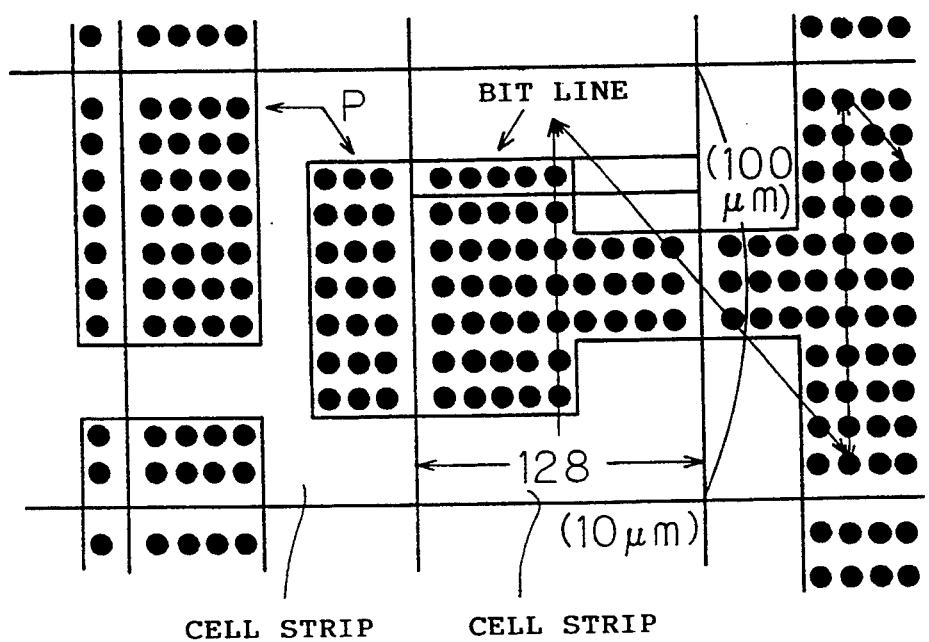
FIG. 13 is a diagram of an exposure pattern.

FIG. 13 is a diagram of exposure patterns supplied to the data extension circuits 303-1 and 303-2. In FIG. 13, dots "." denote dots to be exposed, and each exposure pattern is expressed by dots ".". An exposure pattern P is divided into a plurality of cell strips extending in the longitudinal direction (the vertical direction in FIG. 13). Each of the cell strips includes bit lines extending in the lateral direction (the horizontal direction in FIG. 13), each of the bit lines including of 128 exposure dots. In the typical case, the cell strip has a length of approximately 100 μm in the longitudinal direction and a length of approximately 10 μm in the lateral direction. In the sub-scan, approximately 10 cell strips are successively scanned, and this scanning operation is repeatedly carried out in the main scan.

A description will now be given of the operation carried out when the blanking aperture array 85 is cleaned. The gas containing a main component of oxygen is introduced into the column tube 72 from a portion I1 shown in FIG. 10 in the state in which the valve 80 is closed. At this time, the column tube 72 is exhausted in order to keep the insides of the column tube 72 and the main chamber 73 at a pressure between 0.1 Torr and 4 Torr. In the structure shown in FIG. 10, the gas flows downwards (down-flow). At this time, the valves 81 and 82 are kept in the open state.

The high-frequency signal and the ground-potential signal are applied to a plurality of electrodes 71 of the cleaning electrode unit 86 (eight electrodes 71 in the structure shown in FIGS. 6A and 6B). In order to stably generate the plasma radical state, it is preferable to set the frequency of the high-frequency signal to 100 kHz to 800 kHz and set the oscillating output to be equal to or less than 100 W and to set the total application time to be equal to or less than 10 minutes. It is preferable that a one-minute or less continuous application of the high-frequency signal is repeadedly performed within the above total application time at cooling intervals of a few minutes. Hence, the inside of the column tube 72 including the periphery of the blanking aperture array 85 is kept in the plasma radical state, whereby the blanking aperture array 85 can be cleaned. Of course, other parts exposed to the plasma radical state can be cleaned.

It is possible to introduce the gas containing the main component of oxygen into the main chamber 73 from a portion I2 shown in FIG. 10 and to exhaust the gas by the exhaust pump 75. In this case, the gas flows upwards (upper-flow). Further, it is also possible to introduce the gas containing the main component of oxygen into the space including the blanking aperture array 85 and the cleaning electrode unit 86 in the state in which the valves 81 and 82 are closed and to exhaust the gas by the exhaust pump 74. In this case, it becomes possible to more effectively clean the blanking aperture array 85.

It will be noted that the high-frequency signal can be generated by a high-frequency signal source which generates a high-frequency signal applied to the blanking aperture array 85, rather than a special generating source for cleaning.

Figure 14A:
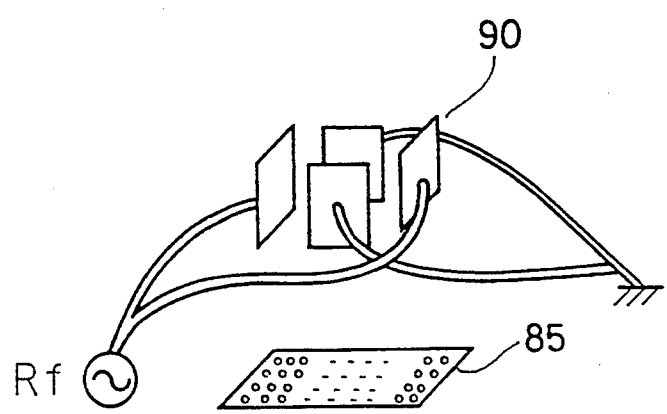
FIG. 14A is a perspective view of a cleaning electrode unit for cleaning the blanking aperture array used in the second embodiment of the present invention.
Figure 14B:
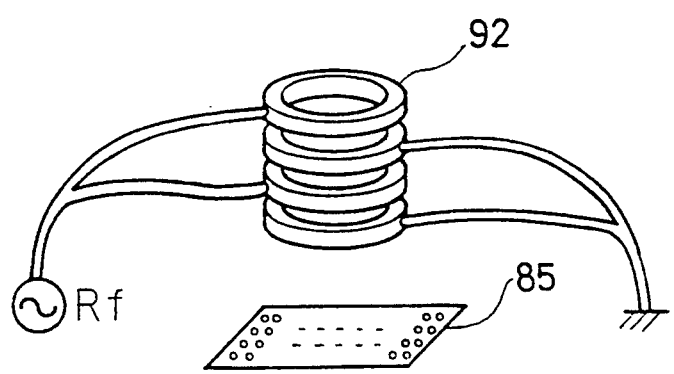
FIG. 14B is a perspective view of another cleaning electrode unit for cleaning the blanking aperture array used in the second embodiment of the present invention.

The cleaning electrode unit 86 is not limited to that shown in FIGS. 5A and 5B, and electrodes having other structures can be used. For example, as shown in FIG. 14A, it is possible to form the cleaning electrode unit with at least one pair 90 of opposite electrodes (two pairs are used in FIG. 14A), each of the electrodes having a plate shape or a recess surface. It is preferable to apply the high-frequency signal and the ground-potential signal to the electrodes of each of the pairs, as shown in FIG. 14A. Alternatively, as shown in FIG. 14B, at least one ring-shaped electrode 92 (four electrodes are used in FIG. 14B) can be used. It is preferable to apply different signals to adjacent ring-shaped electrodes, as shown in FIG. 14B.

It is possible to directly apply the high-frequency signal and the ground-potential signal to the blanking aperture array 85, rather than use of the cleaning electrode unit 86. The following description relates to such a cleaning method.

Figure 15A:
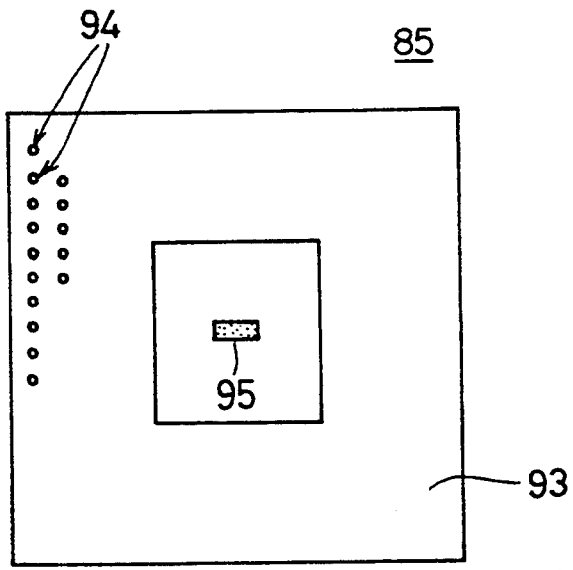
FIG. 15A is a plan view of the blanking aperture array used in the second embodiment of the present invention.
Figure 15B:
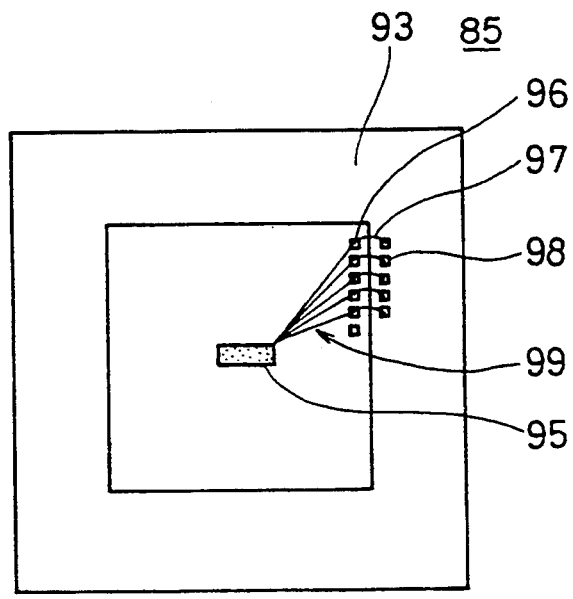
FIG. 15B is a bottom view of the blanking aperture array used in the second embodiment of the present invention.

FIG. 15A is a plan view of the blanking aperture array 85, and FIG. 15B shows a bottom view thereof. The blanking aperture array 85 includes a supporting member 93, an array part 95, and a large number of signal input pins 94 projecting from the supporting member 93. As shown in FIG. 15B, a large number of leads 99 radially extends from the array part 95, and are connected to bonding pads 96 formed on a stacked layer structure 100 (FIG. 16), as will be described in detail later. The bonding pads 96 are connected, by bonding wires 98, to bonding pads 97 supported by the supporting member 93.

Figure 16:
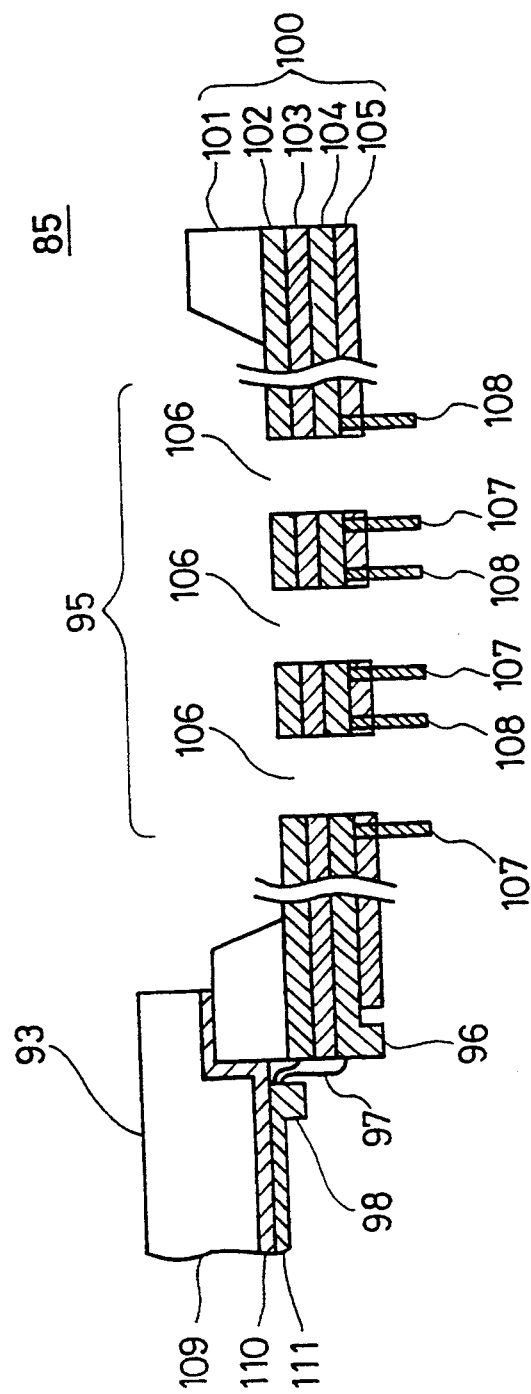
FIG. 16 is a cross-sectional view of an essential part of the blanking aperture array used in the second embodiment of the present invention.

FIG. 16 is a diagram showing the array part 95 and its periphery. The array part 95 has the above-mentioned stacked layer structure 100, which includes a silicon layer 101, a boron-doped impurity diffused layer 102, an intermediate insulating layer 103, an interconnection (wiring) layer 104 and a surface insulating layer 105, these layers being stacked in that order from the top thereof. The stacked layer structure 100 includes a plurality of through holes 106 arranged in rows and columns. These through holes 106 function as apertures of the blanking aperture array 85.

Each of the apertures 106 is equipped with a pair of electrodes 107 and 108 provided so as to project from the surface insulating layer 105. The electrode 107 is used as a ground electrode, and the electrode 108 is used as an active electrode. The electrode 107 is connected to a ground interconnection pattern formed in the interconnection layer 104, and the electrode 108 is connected to an active interconnection pattern formed in the interconnection layer 104. The pairs of electrodes 107 and 108 can be controlled independently.

Figure 17:
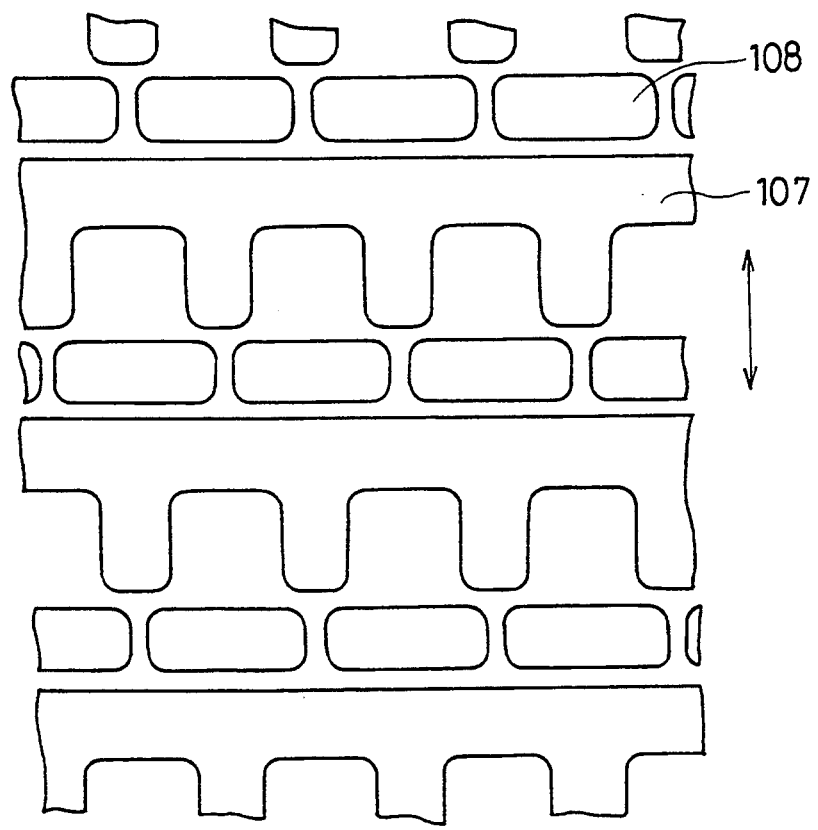
FIG. 17 is a bottom view of an essential part of the blanking aperture array used in the second embodiment of the present invention.

FIG. 17 is a bottom view of the blanking aperture array 85 shown in FIG. 16. The cross section shown in FIG. 15 corresponds to a view taken along a line extending in the direction indicated by the arrow shown in FIG. 17. The ground electrodes 107 are formed in common to a plurality of apertures, and the active electrodes 108 are provided for the respective apertures.

The supporting member 93 has an insulating layer 110 and an interconnection layer 11. The interconnection layers 11 respectively have interconnection patterns connected, via bonding wires 97, to the ground interconnection patterns and the active interconnection patterns formed in the interconnection layers 104. Further, the interconnection layers 111 include interconnection patterns connected to the impurity diffused layers 102 via the bonding wires 97.

Figure 18:
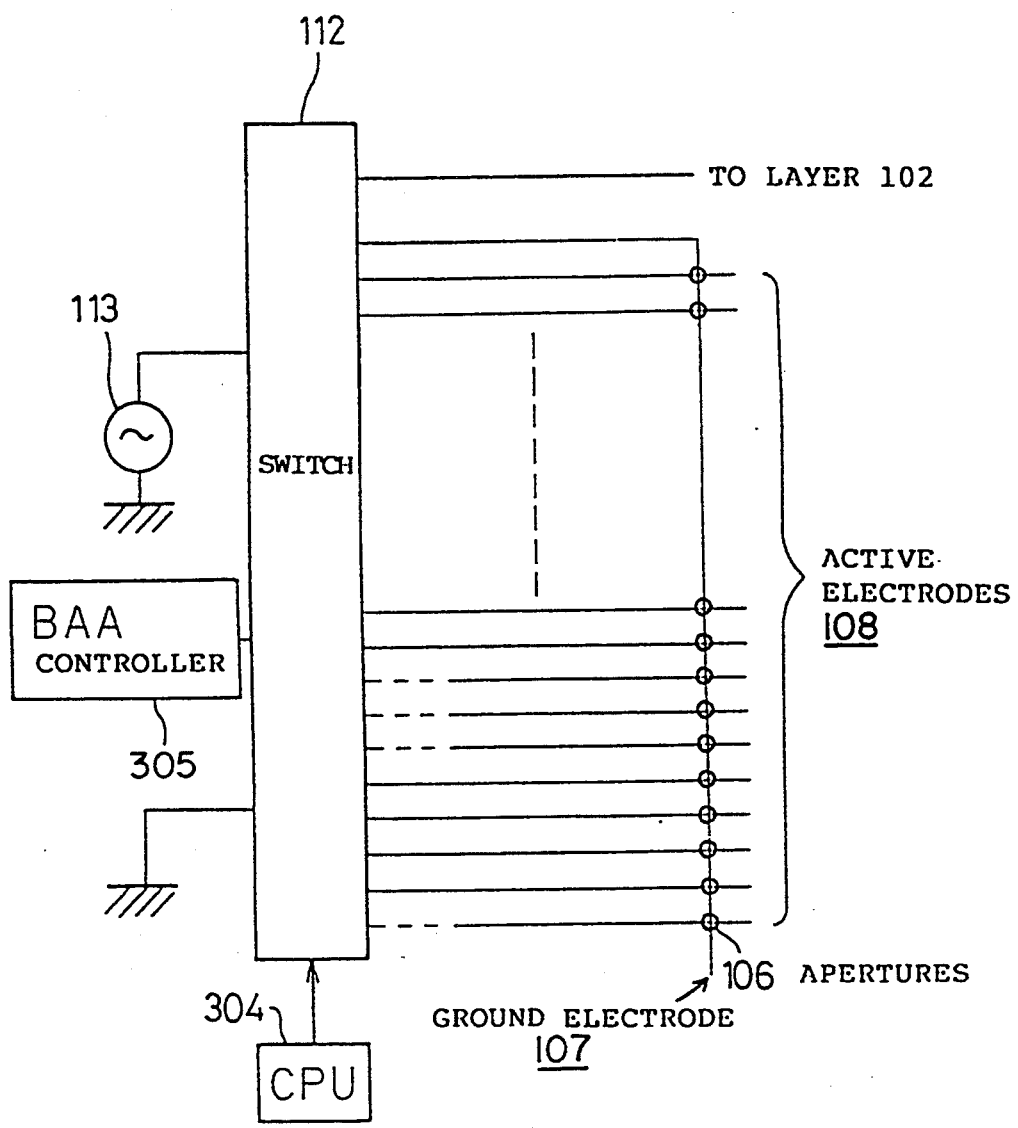
FIG. 18 is a diagram of connections between the electrodes of the blanking aperture array and signal sources.

FIG. 18 is a schematic view of the interconnection lines related to the blanking aperture array 85. The interconnection lines extending from the supporting member 93 to the outside of the blanking aperture array 85 via the supporting member 84 (FIG. 10) are respectively connected, via a switch 112, to one of a high-frequency signal source 113, the ground and a BAA controller 305. The BAA controller 305 corresponds to parts of the control system shown in FIG. 12 between the buffer memory (BUF) and the DAC/AMP 301. A pair of ground electrode 107 and active electrode 108 is provided at a crossing point where a plurality of active interconnection lines extending from the switch 112 and the common ground line cross (of course, these lines are not connected together at the crossing point). The impurity diffused layers 102 can be connected to either the high-frequency signal source 113 or the ground via the switch 112. The switch 112 is controlled by the CPU 304 shown in FIG. 12.

In the exposure process, the switch 112 sets the impurity diffused layers 102 to the ground potential, and applies the BAA data to the active electrodes 106 of the apertures 106 by which the electron beam to be deflected in accordance with the pattern to be drawn. Further, the ground electrode 107 is set to the ground potential.

In order to clean the blanking aperture array 85, the switch is controlled in accordance with one of the following four methods. The first method is to apply the high-frequency signal to the impurity diffused layers 102 and ground the ground electrode 107 and the active electrode 108. It is preferable that the high-frequency signal satisfies the afore-mentioned conditions. That is, the frequency of the high-frequency signal is set to 100 kHz to 800 kHz, the oscillating output is set equal to or less than 100 W, and the total application time is set equal to or less than 10 minutes. Preferably, one-minute or less continuous application of the high-frequency signal is repeatedly carried out within the total application time at cooling intervals of a few minutes. According to the first method, it becomes possible to apply the plasma radical state to the upper surface of the blanking aperture array 85 (the sides of the impurity diffused layers) and its periphery and to clean these parts.

The second method is to ground the impurity diffused layers 102 and apply the high-frequency signal to the ground electrode 107. Normally, the ground electrode 107 are commonly connected together, so that the high-frequency signal is applied to all the ground electrodes 107. Further, the active electrodes 108 are grounded. The applied high-frequency signal is required to have the aforementioned conditions. According to the second method, it is possible to apply the plasma radical state to the lower surface of the blanking aperture array 85 (the sides of the surface insulating layers 105) and its periphery and to clean these parts.

The third method is to ground the impurity diffused layers 102 and the ground electrodes and apply the high-frequency signal to all or some active electrodes 108. When the high-frequency signal is applied to some active electrodes 108, it is applied to the active electrodes 108 every other electrode. The applied high-frequency signal is required to satisfy the aforementioned conditions. According to the third embodiment of the present invention, it is possible to apply the plasma radical state to the lower surface of the blanking aperture array 85 (the sides of the surface insulating layers 105) and its periphery and to clean these parts.

The fourth method is to apply data on an exposure pattern having a predetermined rule generated by the BAA controller 330 used at the time of exposure to the active electrodes 108. For example, the exposure pattern having a predetermined rule is such as 101010 . . . or 11001100 . . . .

The present invention is not limited to the specifically disclosed embodiments, and variations and modifications may be made without departing from the scope of the present invention. For example, it is possible to apply the cleaning electrode unit 86 to cleaning of the slit 15 shown in FIG. 3.

What is claimed is:

1. A charged particle beam exposure apparatus having an interior within which a charged particle beam is projected along an optical axis and onto a member thereby to oppose a pattern on the member, said charged particle beam exposure apparatus comprising:

a plurality of electrodes disposed around the optical axis of the charged particle beam and within said interior of said apparatus;

first means for introducing a gas containing oxygen as a main component into the interior of the apparatus and for holding said interior of the apparatus at a degree of vacuum between 0.1 Torr and 4 Torr; and second means for applying a selected one of a high-frequency signal, having a frequency between 100 kHz and 800 kHz, and a reference signal to each of said plurality of electrodes and thereby for generating a plasma radical state of the gas in said interior of the apparatus so that the high-frequency signal is applied to at lest one electrode and the reference signal is applied to at least one other electrode, of the plurality of electrodes, and so that a deposition present in the apparatus can be eliminated.

2. The charged particle beam exposure apparatus as claimed in claim 1, wherein said second means applies further comprises third means and fourth means for applying the high-frequency signal and the reference signal, respectively, to two adjacent add respective electrodes of the plurality of electrodes.

3. The charged particle beam exposure apparatus as claimed in claim 1, wherein said plurality of electrodes comprise a plurality of electrodes of an electrostatic deflector of the charged particle beam exposure apparatus.

4. The charged particle beam exposure apparatus as claimed in claim 3, wherein said second means further comprises third means and fourth means for applying the high-frequency signal and the reference signal, respectively, to two adjacent and respective electrodes of the plurality of electrodes of the electrostatic deflector.

5. The charged particle beam exposure apparatus as claimed in claim 3, wherein said electrostatic deflector comprises:
an electrode attachment cylinder;
a plurality of substantially L-shaped electrode supporting members formed on an inner surface of the electrode attachment cylinder; and
a plurality of electrically conductive films formed on the inner surface of the electrode attachment cylinder including said plurality of substantially L-shaped electrode supporting members, said plurality of electrodes of said electrostatic deflector comprising said plurality of substantially L-shaped electrode supporting members and said plurality of electrically conductive films.

6. The charged particle beam exposure apparatus as claimed in claim 3, wherein:
a distance between opposite electrodes, of the plurality of electrodes of said electrostatic deflector, is between 4 mm and 10 mm; and
a distance between lower ends of the plurality of electrodes of said electrostatic deflector and said member to be exposed is equal to or less than 25 mm.

7. The charged particle beam exposure apparatus as claimed in claim 1, wherein said second means further comprises means for generating the high-frequency signal having a power of 100 W or less for a total time of 10 minutes or less at the time of cleaning, said total time including repeated, continuous high-frequency signal power intervals, each of one minute or less and separated by cooling intervals equal to a few minutes.

8. The charged particle beam exposure apparatus as claimed in claim 1, wherein said plurality of electrodes comprises a plurality of electrodes of a blanking aperture array of said charged particle beam exposure apparatus.

9. The charged particle beam exposure apparatus as claimed in claim 8, wherein:
said blanking aperture array comprises a plurality of stacked layers having semiconductor layers and insulating layers; and
said second means further comprises third means for applying the high-frequency signal to at least one of the semiconductor layers.

10. The charged particle beam exposure apparatus as claimed in claim 8, wherein:
the plurality of electrodes of the blanking aperture array comprises ground electrodes which receive a reference signal at the time of exposure and active electrodes which receive signals based on the pattern to be drawn at the time of exposure; and
said second means further comprises means for applying the high-frequency signal to the ground electrodes at the time of cleaning.

11. The charged particle beam exposure apparatus as claimed in claim 8, wherein:
the plurality of electrodes of the blanking aperture array comprise ground electrodes for receiving a reference signal at the time of exposure and active electrodes for receiving signals based on the pattern to be drawn at the time of exposure; and
said second means further comprises means for applying the high-frequency signal to the active electrodes at the time of cleaning.

12. The charged particle beam exposure apparatus as claimed in claim 8, wherein:
the plurality of electrodes of the blanking aperture array comprises ground electrodes which receive a reference signal at the time of exposure and active electrodes which receive signals based on the pattern to be drawn at the time of exposure; and
said second means further comprises means for applying, as said high-frequency signal, pattern data having a predetermined rule to the active electrodes at the time of cleaning.

13. The charged particle beam exposure apparatus as claimed in claim 1, wherein said plurality of electrodes is located above a blanking aperture array of said charged particle beam exposure apparatus.

14. The charge particle beam exposure apparatus as claimed in claim 13, wherein said plurality of electrodes located above the blanking aperture array comprises:
an electrode attachment cylinder;
a plurality of substantially L-shaped electrode supporting members formed on an inner surface of the electrode attachment cylinder; and
a plurality of electrically conductive films formed on the inner surface of the electrode attachment cylinder and including said plurality of substantially L-shaped electrode supporting members.

15. The charged particle beam exposure apparatus as claimed in claim 13, wherein said plurality of electrodes located above the blanking aperture array are arranged about the optical axis and include opposite electrodes.

16. The charged particle beam exposure apparatus as claimed in claim 13, wherein said plurality of electrodes located above the blanking aperture array include ring-shaped electrodes arranged about the optical axis.

17. The charged particle beam exposure apparatus as claimed in claim 8, wherein said second means further comprises means for generating the high-frequency signal having a power of 100 W or less for a total time of 10 minutes or less at the time of cleaning, said total time including repeated, continuous high-frequency signal power intervals each of one minute or less and separated by cooling intervals equal to a few minutes.

18. The charged particle beam exposure apparatus as claimed in claim 1, wherein said first means comprises means further for flowing the gas inside the charged particle beam exposure apparatus.

19. The charged particle beam exposure apparatus as claimed in claim 5, further comprising a cylindrical member disposed around said electrode attachment cylinder.

20. A charged particle beam exposure method in which a charged particle beam is projected onto a member to be exposed to thereby form a pattern thereon, said charged particle beam exposure method comprising:
(a) introducing a gas containing oxygen as a main component into an interior of a charged particle beam exposure apparats including a plurality of electrodes;

(b) holding said inside of the apparatus at a degree of vacuum between 0.1 Torr and 4 Torr; and (c) applying a selected one of a high-frequency signal, having a frequency between 100 kHz and 800 kHz, and a reference signal-to each of said plurality of electrodes so that the high-frequency signal is applied to at least one electrode and the reference signal is applied to at least one other electrode of the plurality of electrodes, and thereby for generating a plasma radical state of the gas in said interior of the apparatus so that a deposition present in the apparatus can be eliminated.

21. The charged particle beam exposure method as claimed in claim 20, wherein said step (c) further comprises applying the high-frequency signal and the reference signal to the plurality of electrodes comprising electrodes of an electrostatic deflector.

22. The charged particle beam exposure method as claimed in claim 20, wherein said step (c) further comprises applying the high-frequency signal and the reference signal as two adjacent electrodes, respectively, of the plurality of electrodes.

23. The charged particle beam exposure method as claimed in claim 20, wherein said step (c) further comprises applying the high-frequency signal and the reference signal to respective, different electrodes of said plurality of electrodes comprising electrodes of a blanking aperture array.

24. The charged particle beam exposure method as claimed in claim 20, wherein said step (c) further comprises applying to said electrodes to which said high-frequency signal is applied during cleaning, pattern data having a predetermined rule at the time of exposure.

25. The charged particle beam exposure method as claimed in claim 20, further comprising the step of projecting the charged particle beam onto four corners of an electrostatic area after cleaning is completed and detecting beam drifts observed by projecting the charged particle beam onto the four corners.

* * * * *

UNITED STATES PATENT AND TRADEMARK OFFICE
CERTIFICATE OF CORRECTION

PATENT NO. : 5,401,974
DATED : Mar. 28, 1995
INVENTOR(S) : OAE et al.

It is certified that error appears in the above-indentified patent and that said Letters Patent is hereby corrected as shown below:

Col. 2, line 25, change "caused by a" to --caused by--.

Col. 3, line 50, change "N." to --No.--.

Col. 5, line 62, delete "10".

Col. 6, line 7, change "D8," to --D8--.

Col. 7, line 29, change "therein" to --thereby--.

Col. 8, line 66, after "film" insert --56a'--.

Col. 9, line 18, change "on" to --in-- and change "in" to --on--.

Col. 10, line 10, delete "of";
line 12, change "Connected" to --connected--;
line 46, delete "the".

Col. 17, line 19, change "11" to --111--;
line 20, change "11" to --111--.

Col. 18, line 59, change "lest" to --least--;
line 67, change "add" to --and--.

UNITED STATES PATENT AND TRADEMARK OFFICE
CERTIFICATE OF CORRECTION

PATENT NO.  : 5,401,974
DATED       : Mar. 28, 1995
INVENTOR(S) : OAE et al.

It is certified that error appears in the above-indentified patent and that said Letters Patent is hereby corrected as shown below:

Col. 20,  line 53, change "means comprises" to --means further comprises--;
          line 54, delete "further";
          line 67, change "apparats" to --apparatus--.

Col. 21,  line 5, change "signal-to" to --signal to--;
          line 8, after "electrode" insert --,--.

Col. 22,  line 1, change "as" to --to--.

Signed and Sealed this

Thirty-first Day of October 1995

Attest:

BRUCE LEHMAN

Attesting Officer

Commissioner of Patents and Trademarks